US005640105A

United States Patent [19]
Sobelman et al.

[11] Patent Number: 5,640,105
[45] Date of Patent: Jun. 17, 1997

[54] CURRENT MODE NULL CONVENTION THRESHOLD GATE

[75] Inventors: Gerald E. Sobelman, Minnetonka; Karl M. Fant, Minneapolis, both of Minn.

[73] Assignee: Theseus Research, Inc., St. Paul, Minn.

[21] Appl. No.: 711,560

[22] Filed: Sep. 10, 1996

Related U.S. Application Data

[63] Continuation of Ser. No. 368,811, Jan. 6, 1995, abandoned, which is a continuation-in-part of Ser. No. 318,510, Oct. 5, 1994, which is a continuation-in-part of Ser. No. 220,636, Mar. 31, 1994, which is a continuation-in-part of Ser. No. 74,288, Jun. 8, 1993, Pat. No. 5,305,463, which is a continuation of Ser. No. 702,016, May 17, 1991, abandoned.

[51] Int. Cl.$^6$ ............................................. H03K 19/017
[52] U.S. Cl. .............................. 326/36; 326/93; 326/121
[58] Field of Search ............................ 326/35–36, 59, 326/93, 95, 98, 121

[56] References Cited

U.S. PATENT DOCUMENTS

| 3,715,603 | 2/1973 | Lerch | 326/36 |
| 4,845,633 | 7/1989 | Furtek | 364/490 |
| 5,121,003 | 6/1992 | Williams | 326/121 |
| 5,305,463 | 4/1994 | Fant et al. | 395/800 |
| 5,382,844 | 1/1995 | Knauer | 326/121 |
| 5,434,520 | 7/1995 | Yetter et al. | 326/93 |

FOREIGN PATENT DOCUMENTS

| 0 566 739 A1 | 10/1993 | European Pat. Off. . |
| 0 570 584 A1 | 11/1993 | European Pat. Off. . |
| 0 578 821 A1 | 1/1994 | European Pat. Off. . |
| WO92/12498 | 7/1992 | WIPO . |
| WO92/16971 | 10/1992 | WIPO . |
| WO94/03929 | 2/1994 | WIPO . |

OTHER PUBLICATIONS

M.R. Greenstreet, T.E. Williams, and J. Staunstrup, Self-Timed Iteration, Elsevier Science Publishers B.V. (North-Holland), IFIP, 1988, pp. 309–322.

Teresa H.-Y. Meng, Robert W. Brodersen, and David G. Messerschmitt, Automatic Synthesis of Asynchronous Circuits from High-Level Specifications, IEEE Transactions on Computer-Aided Design, vol. 8, No. 11, Nov. 1989, pp. 1185–1205.

Ted Williams, Latency and Throughput Tradeoffs in Self-Timed Speed-Independent Pipelines and Rings, Stanford University Technical Report No. CSL-TR-91-482, May 1991.

Jens Sparso and Jorgen Staunstrup, Delay-insensitive multi-ring structures, Integration, the VLSI Journal 15, 1993, Elsevier Science Publishers B.V., pp. 313–340.

Tzyh-Yung Wuu and Sarma B.K. Vrudhula, A Design of a Fast and Area Efficient Multi-Input Muller C-element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self-Timed Rings and Their Application to Division, Stanford University Technical Report No. CSL-TR-91-482, May 1991.

Stephen H. Unger, Asynchronous Sequential Switching Circuits, 1969, pp. 221–229.

(List continued on next page.)

*Primary Examiner*—David R. Hudspeth
*Attorney, Agent, or Firm*—Steptoe & Johnson LLP

[57] ABSTRACT

A NULL convention threshold gate receives a plurality of inputs, each having an asserted state and a NULL state. The threshold gate switches its output to an asserted state when the number of asserted inputs exceeds a threshold number. The threshold gate switches its output to the NULL state only after all inputs have returned to NULL. Signal states may be implemented as distinct current levels.

20 Claims, 21 Drawing Sheets

OTHER PUBLICATIONS

Carver Mead & Lynn Conway, Introduction to VLSI Systems, 1980, pp. 242–262.

Ivan E. Sutherland, Micropipelines, *Communications of the ACM*, Dec. 1989, vol. 32, No. 6.

Wojcik et al., On the Design of Three Valued Asynchronous Modules, *IEEE Transactions on Computers*, Oct. 1980, vol. C–29, No. 10, pp. 889–898.

Tadashi Shibata & Tadahiro Ohmi, A Functional MOS Transistor Featuring Gate–Level Weighted Sum and Threshold Operations, *IEEE Transactions On Electron Devices*, Dec. 1992, vol. 39, No. 6, pp. 1444–1455.

Anthony S. Wojcik & Kwang–Ya Fang, On The Design Of Three–Valued Asynchronous Modules, *IEEE Transactions On Computers*, Oct. 1980, vol. C–29, No. 10, pp. 889–898.

Mark Edward Dean, Strip: A Self–Timed Risc Processor, Jun. 1992.

Daniel Hampel & Robert Winder, Threshold Logic, *IEEE Spectrum*, May 1971, pp. 32–39.

Janusz A. Brzozowski & Carl–Johan H. Seger, Asynchronous Circuits —Monographs in Computer Science, Springer–Verlag New York, Inc., 1995, New York, NY.

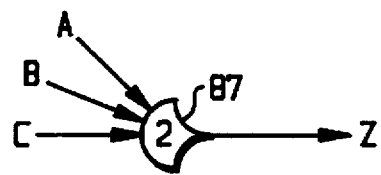
FIG.4a
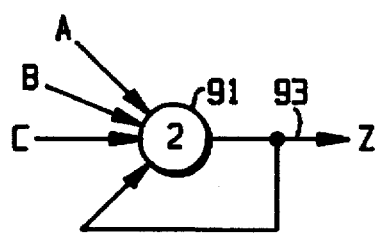
FIG.4b
FIG.4c
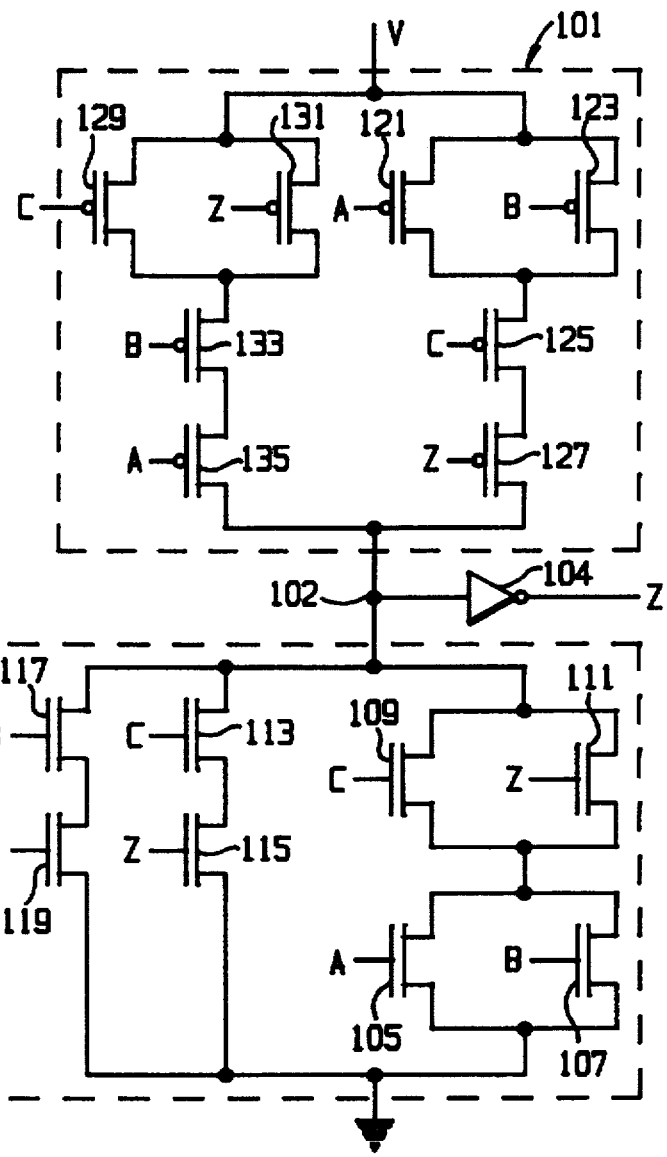

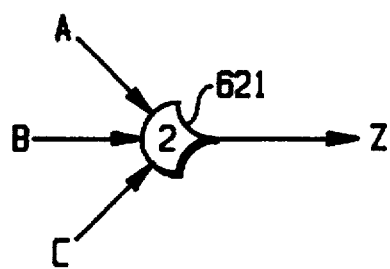
FIG. 17a
FIG. 17b
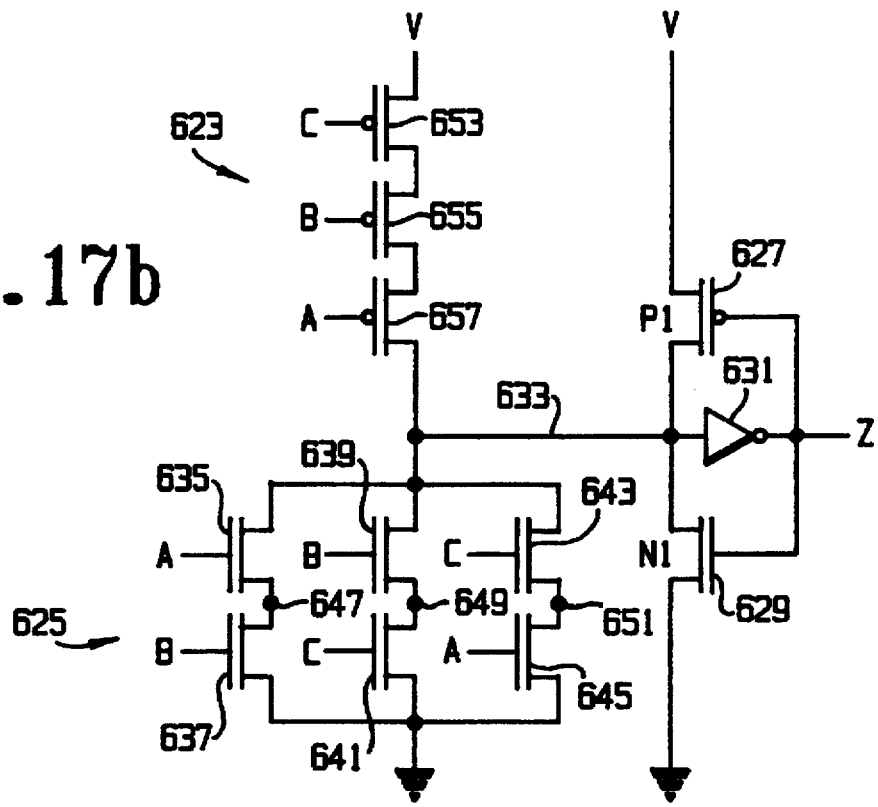
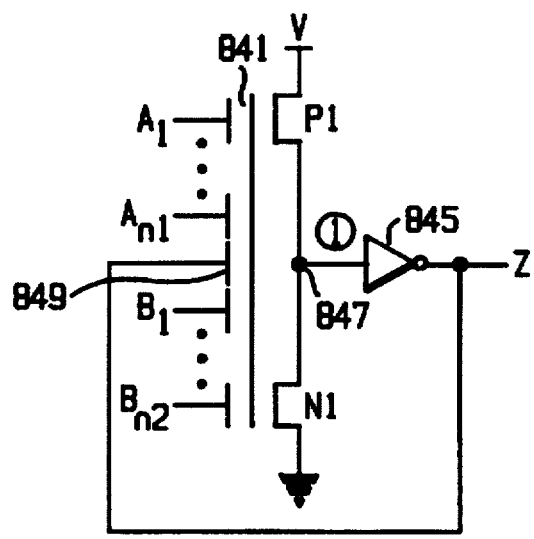
FIG. 26

5,640,105

CURRENT MODE NULL CONVENTION THRESHOLD GATE

This is a continuation of U.S. patent application Ser. No. 08/368,811 filed Jan. 6, 1995 entitled "NULL CONVENTION THRESHOLD GATE, now abandoned;" which is a continuation in part of U.S. patent application Ser. No. 08/318,510 filed Oct. 5, 1994 entitled "NULL CONVENTION THRESHOLD GATE;" which was a continuation-in-part of U.S. patent application Ser. No. 08/220,636 filed Mar. 31, 1994 entitled "NULL CONVENTION LOGIC SYSTEM;" which was a continuation of U.S. patent application Ser. No. 08/074,288 filed Jun. 8, 1993, now U.S. Pat. No. 5,305,463; which was a continuation of U.S. patent application Ser. No. 07/702,016 filed May 17, 1991, abandoned.

BACKGROUND

Previous logic systems, such a boolean logic systems, have employed clocking signals to regulate the sequential processing of binary logic signals. Typically, a sequential logic circuit will respond to multiple inputs to generate an output. As input logic signals propagate through the sequential circuit, the sequential circuit output is unreliable for a period of time corresponding to worst case propagation delays through the individual logic gates. Typically, the output signal is sampled at a time when the output is stable, often by latching the output into a register. The sampling time is set according to an independent clock signal, i.e., one that is not derived from the states of the logic gates themselves.

While these traditional synchronous circuits have become the dominant class of logic, a substantial amount of design analysis is necessary to avoid a variety of timing-related problems, such as race conditions. In addition, the fraction of power and real estate that must be devoted to clocking has become substantial, and in certain instances has become a limiting factor to the total amount of circuitry that can be integrated onto a single chip.

SUMMARY

An object of this invention is to provide a NULL convention threshold gate for use in asynchronous circuits.

A further object of this invention is to provide a NULL convention threshold gate using feedback to hold the gate output asserted until all inputs have returned to NULL.

A further object of this invention is to provide a NULL convention threshold gate using static CMOS transistors.

A further object of this invention is to provide a NULL convention threshold gate using dynamic CMOS transistors.

A further object of this invention is to provide a NULL convention threshold gate using analog devices.

A further object of this invention is to provide a NULL convention threshold gate using floating gate MOS devices.

A further object of this invention is to provide NULL convention threshold gates especially adapted for receiving mutually exclusive assertion groups.

A further object of this invention is to provide asynchronous combinational circuits from interconnected NULL convention threshold gates.

A further object of this invention is to provide NULL convention threshold gates in which signal states are characterized by current states.

These and other objects are achieved by providing NULL convention threshold gate designs. NULL convention gates herein have output signals which switch between two states: asserted and NULL. In general, asserted is taken to be a voltage level near the voltage source, NULL is taken to be a voltage level near ground.

Designs center around a variety of driving devices, including inverting drivers, comparators and Schmitt triggers. The output of the threshold gate switches to NULL when the number of asserted inputs exceeds a threshold number. A feedback signal acts to prevent the driving device from returning the output to NULL until after all inputs have returned to NULL.

Certain designs are especially adapted to handle mutually exclusive assertion groups. In a mutually exclusive assertion group, at most one signal line will be asserted at time.

BRIEF DESCRIPTION OF THE DRAWINGS

The invention will be described below with reference to attached drawings in which:

FIG. 3c illustrates a transistor-level circuit diagram of a static CMOS implementation for the NULL convention threshold gate of FIG. 3a;

FIG. 4a illustrates a symbol for a three-input, threshold-two (two-of-three) NULL convention logic gate;

FIG. 4b illustrates a symbol for a four-input majority function gate (no hysteresis) with feedback;

FIG. 4c illustrates a transistor-level circuit diagram of a static CMOS implementation for the gate of FIG. 4a;

FIG. 5b illustrates a transistor-level circuit diagram of a static CMOS implementation for the gate of FIG. 5a;

FIG. 6b illustrates a transistor-level circuit diagram of a static CMOS implementation for the gate of FIG. 6a ;

FIG. 7b illustrates a transistor-level circuit diagram of a static CMOS implementation for the gate of FIG. 7a;

FIG. 8b illustrates a transistor-level circuit diagram of a static CMOS implementation for the gate of FIG. 8a;

FIG. 9b illustrates a transistor-level circuit diagram of a static CMOS implementation for the gate of FIG. 9a;

FIG. 10b illustrates a transistor-level circuit diagram of a static CMOS implementation for the gate of FIG. 10a;

FIG. 11b illustrates a transistor-level circuit diagram of a static CMOS implementation for the gate of FIG. 11a;

FIG. 12b illustrates a transistor-level circuit diagram of a static CMOS implementation for the gate of FIG. 11a;

FIG. 16b illustrates a transistor-level circuit diagram of a dynamic CMOS implementation for the gate of FIG. 16a;

FIG. 17a illustrates a symbol for a three-input threshold-two gate (two-of-three);

FIG. 17b illustrates a transistor-level circuit diagram of a dynamic CMOS implementation for the gate of FIG. 17a;

FIG. 18b illustrates a transistor-level circuit diagram of a dynamic CMOS implementation for the gate of FIG. 18a;

FIG. 19b illustrates a transistor-level circuit diagram of a dynamic CMOS implementation for the gate of FIG. 19a;

FIG. 20b illustrates a transistor-level circuit diagram of a dynamic CMOS implementation for the gate of FIG. 20a;

FIG. 23 illustrates transistor-level circuit diagram of a floating-gate MOSFET implementation for the 4-of-5 gate of FIG. 12a;

FIG. 26 illustrates a transistor-level circuit diagram of a complementary floating-gate MOSFET implementation for a 2-of-n gate having two mutually exclusive assertion groups;

DETAILED DESCRIPTION OF THE PREFERRED EMBODIMENTS

The scope of the invention is defined by claims at the conclusion of the description of the preferred embodiments. However, the organization, operation, advantages and objects of the invention can be more fully appreciated from the following description.

A NULL convention combinational circuit generates a result value set in response to an input value set. An important aspect of NULL convention circuits is that any particular input may have a meaningful value or a NULL value which has no meaning. The very presence of a non-NULL value indicates that the value has meaning, and no external clock is required to indicate that a value is meaningful. Further information regarding NULL convention logic can be found in U.S. Pat. No. 5,305,463, which is incorporated here by reference. Certain aspects are reiterated here for convenience.

NULL convention differs from traditional boolean logic where each signal line may have one of two meaningful states. In traditional logic that uses CMOS or TTL implementation, a low voltage level on a signal line means "logic false" or the number "zero." A high voltage level on the same line means "logic true" or the number "one." Thus a signal line may assume one of two values, either of which may or may not be meaningful.

NULL convention has multiple implementations which include a NULL state which has no meaning. In one implementation, two separate signal lines would be used in order to convey two meaningful values. For example, logic "false" would be conveyed by asserting a high voltage on the first line and a low voltage on the second line. Logic "true" would be conveyed by asserting a low voltage on the first line and a high voltage on the second line. NULL would be conveyed by low voltage levels on both lines. (High voltage levels on both lines is unused.) In this example, meaning is expressed according to the signal line asserted, not by the choice of voltage level. A high voltage level "asserts" the meaning of the line. A low voltage level is meaningless.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used as long as the requisite number of states can be differentiated. Discussions here will assume an implementation in which each signal line may assume two voltage levels, with a high level asserting meaning and the ground voltage level being NULL. This provides voltage levels as concrete examples to aid in explanation, but the invention is not limited to these voltage-level examples.

Figure 1:
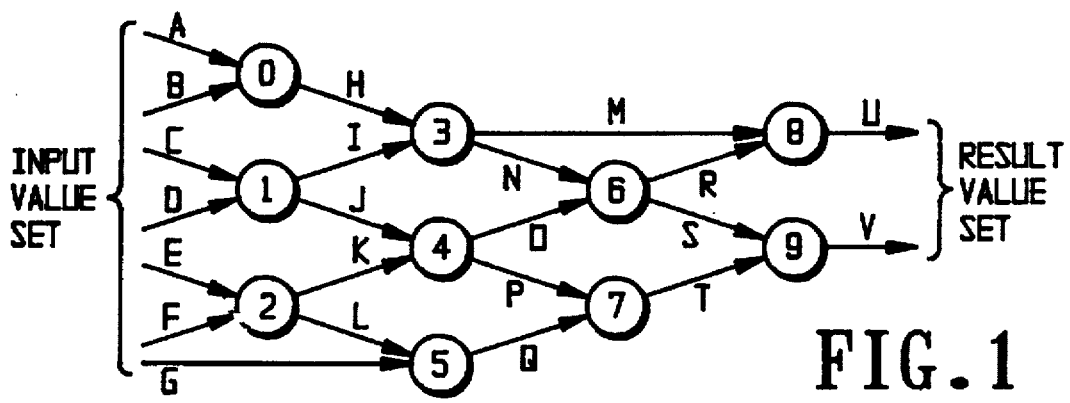
FIG. 1 illustrates a NULL convention combinational circuit.

Another important aspect of NULL convention circuits is the way that meaningful and NULL signals propagate through a combinational circuit. All inputs to a NULL convention logic element must be meaningful before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U,V, and internal connection lines are labeled with letters H–T. Signal lines are schematic, and may be individual conductors, multiple conductors or another NULL convention configuration.

In a NULL convention circuit, a logic gate transitions from a NULL to a meaningful output value after all inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the sequential circuit. Logic gates zero through two, which are directly connected to input lines, will provide meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

The NULL convention logic gates discussed here also exhibit a second characteristic; their outputs transition from a meaningful value to NULL only when all inputs have switched to NULL. In this way, NULL values propagate through the network cleanly, and the very presence of NULL values at the output is sufficient to indicate that all gates in the network have returned to NULL output states.

Figure 2A:
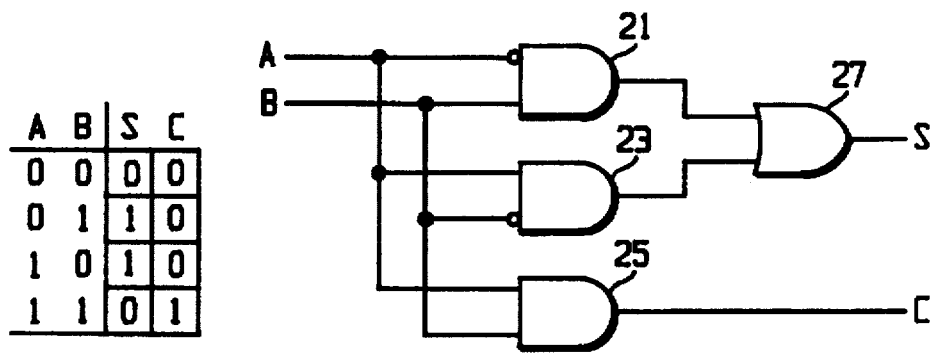
FIG. 2a illustrates a Boolean half-adder.

FIG. 2a illustrates a Boolean half-adder constructed of three AND gates 21, 23, 25 and an OR gate 27. The half adder has two input signal lines A and B, and two output line S (sum) and C (carry). Each input line may assume one of two meaningful values: "zero" and "one." Each output line may assume one of two meaningful values: "zero" and "one." The half adder implements a transfer function such that:

i) when both inputs are zero, sum (S) and carry (C) outputs are "zero;"

ii) when a single input is "one" (and the other is "zero"), sum is "one" and carry is "zero;"

iii) when both inputs are "one," sum is "zero" and carry is "one."

Figure 2B:
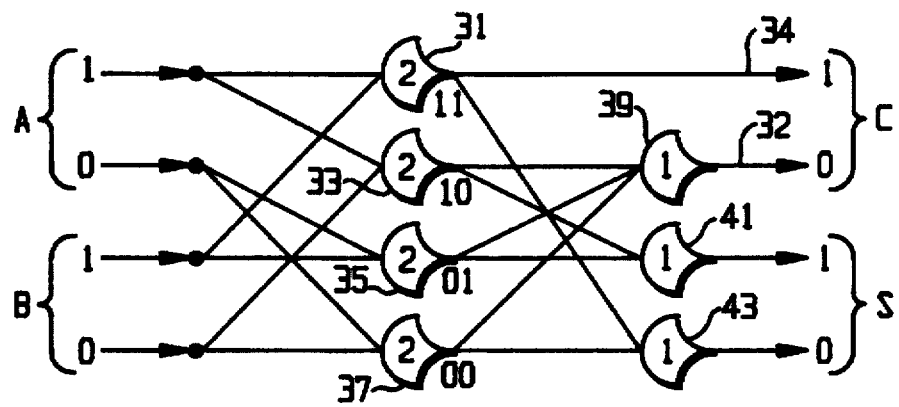
FIG. 2b illustrates a "two-wire" NULL convention half adder.

For comparison, FIG. 2b illustrates a "two-wire" NULL convention half adder. It is similar to the boolean half-adder of FIG. 2a in that there are two inputs A and B and two outputs S and C, and it implements the same transfer function. Unlike the Boolean circuit, the NULL convention half-adder has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line 32 (designated as having a meaning "zero" when asserted) is driven to its meaningful voltage level, while the second signal line is held at the NULL voltage level. In order to assert a value "carry equals one," the first signal line is held at the NULL voltage level, while the second signal line 34 (designated by design as having a meaning "one") is driven to the meaningful voltage level. The half-adder can also assert "carry has no meaning" by holding both carry signal lines at NULL. It is not permitted to have both carry lines at the meaningful voltage level. Similarly, the remaining inputs and outputs (A, B, S) each have a pair of signal lines. Each pair of lines is a "mutually exclusive assertion group," which means only one line of any group will be asserted at a time.

Hereafter, when a NULL convention circuit switches a signal line to a meaningful value, it will be said that the circuit "asserts" the line, or that the line is "asserted." When a NULL convention circuit switches a signal line to a NULL value, the line will be said to be NULL.

The two carry lines form a group in which at most one line may be asserted (i.e., assume a meaningful value). Such a group is referred to has a "mutually exclusive assertion group." In other design situations, mutually exclusive assertion groups may have more than two lines. A single line, by itself, can be considered a mutually exclusive assertion group.

Internally, the NULL convention half adder is made of six threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("threshold-two gate"). The output of a threshold-two gate is asserted when two (both) of the input lines are asserted. One of the gates 39 has three input signal lines and threshold of one ("threshold-one gate"). The output of the threshold-one gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder exhibits the characteristic that it switches to a meaningful value only when the requisite number of inputs becomes meaningful, and each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a NULL output only when all inputs are NULL.

Figure 3A:
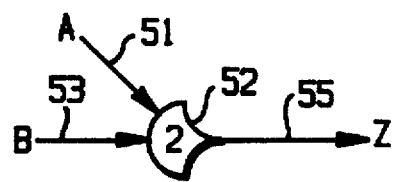
FIG. 3a illustrates a symbol for a two-input, threshold-two (two-of-two) NULL convention logic gate.

FIG. 3a illustrates a symbol 52 for a two-input, threshold-two (two-of-two) NULL convention logic gate having inputs A and B and output Z. Here, each input line 51,53 and the output line 55 each represent one signal line which is capable of assuming a meaningful value or NULL. When both input signals A,B are asserted, the output Z is asserted. After the output has been asserted, the output returns to NULL only when both inputs A,B return to NULL.

Figure 3B:
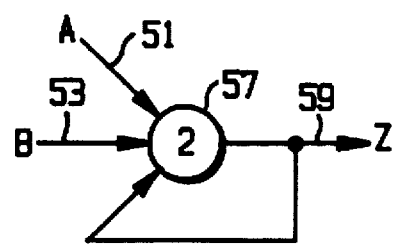
FIG. 3b illustrates a symbol for a three-input majority-function gate with feedback.

FIG. 3b illustrates a symbol 57 for a three-input majority-function gate having two inputs A and B and an output Z as in FIG. 3A. The output line 59 is fed back as an input, which conceptually provides the functionality of the two-of-two NULL convention threshold gate of FIG. 3a. In isolation (i.e., without the feedback signal), the majority-function gate operates without hysteresis. When the number of asserted inputs is greater than two, the majority function gate output is asserted. When the number of asserted inputs is less than two, the majority function gate output goes NULL.

With feedback, the majority-function gate has hysteresis. When the output Z is asserted, the feedback line provides one asserted input. If the number of asserted inputs drops to one, then the feedback line provide a second asserted input to hold the majority function gate to an asserted output. The output Z will switch to NULL only when both independent inputs A and B become null. Conversely, when the output Z is NULL, the feedback line provides one NULL input. The output Z will be asserted only when both independent inputs A and B are asserted.

Figure 3C:
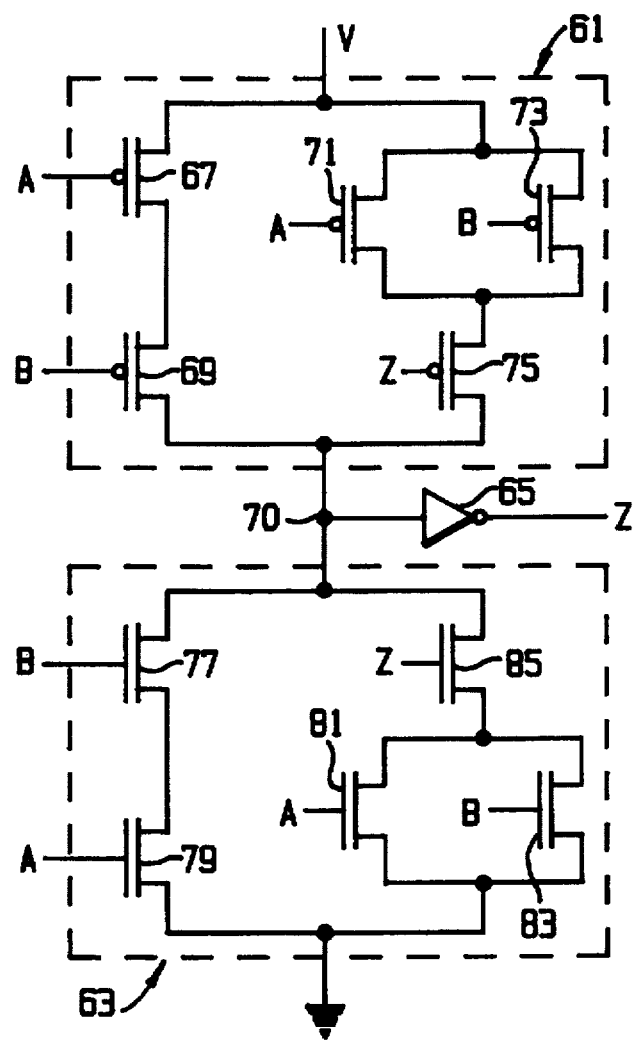

FIG. 3c illustrates a transistor-level circuit diagram of a static CMOS implementation for the NULL convention threshold gate of FIG. 3a. The implementation includes a pull-up sub-circuit 61, a pull-down sub-circuit 63, and a driver 65. The input to the driver 65 is taken from a signal junction 70.

The pull-up sub-circuit 61 includes a series pair of PMOS transistors 67,69 connecting a voltage source V to a signal junction 70. The voltage source B is also connected to the signal junction 70 through a parallel pair of PMOS transistors 71, 73, which is in series with a feedback PMOS transistor 75.

The pull-down sub-circuit 63 includes a series pair of NMOS transistors 77,79 connecting signal junction 70 to ground. The signal junction 70 is also connected to ground through a parallel pair of NMOS transistors 81,83, which is in series with a feedback NMOS transistor 85.

One input signal A is connected to the gates of one PMOS series transistor 69, one PMOS parallel transistor 71, one NMOS series transistor 79 and one NMOS parallel transistor 81. The other input signal B is connected to the gates of one PMOS series transistor 67, one PMOS parallel transistor 73, one NMOS series transistor 77 and one NMOS parallel transistor 83. The output Z is connected to the gates of both feedback transistors 75,85.

Operation of the circuit will assume that NULL is a voltage at or near ground, and that asserted is at or near the voltage source V. The value for the asserted voltage may be sized for the fabrication technology.

When both input signals A,B are NULL, the PMOS series transistors 67,69 are on, the NMOS series transistors 77,79 are off, and the signal junction 70 is pulled to the voltage source V. The driver input (which is taken from the signal junction 70) is at the source voltage level, and the driver 65 switches its output Z to NULL. The parallel PMOS transistors 71,73 are also on, as is the PMOS feedback transistor 75. Thus, the signal junction 70 is switched to the voltage source through the parallel PMOS transistors 71,73 as well. All of the NMOS transistors are off.

When both input signals A,B are asserted, the NMOS series transistors 77,79 are on, the PMOS series transistors 67,69 are off, and the signal junction 70 is pulled to ground. The driver input is at the ground voltage, and the driver 65 asserts its output. The parallel NMOS transistors 81,83 are also on, as is the NMOS feedback transistor 85. Thus, the signal junction 70 is switched to ground through the parallel NMOS transistors 81,83 as well. All of the PMOS transistors are off.

When one input signal is asserted and the other is NULL, one transistor of each series pair 67,69,77,79 is on, and the other transistor is off. Thus, the series transistors do not connect the signal junction 70 either to the voltage source or to ground. But one transistor of each parallel pair 71,73,81, 83 is on. The voltage of the signal junction 70 (and thus of the output Z) is determined by the state of the feedback transistors 75,85. If the prior output Z was NULL, the PMOS feedback transistor 75 is on, the signal junction 70 is at the source voltage, and the driver output remains NULL. If the prior output Z was asserted, the NMOS feedback transistor 85 is on, the signal junction 70 is at ground, and the driver output remains asserted.

Thus the series transistors 67,69,77,79 determine the output state when both inputs are NULL and when both inputs are asserted. The feedback transistors 75,85 provide the hysteresis when one input is asserted and the other input is NULL. The parallel PMOS transistors 71,73 serve to disengage the PMOS feedback transistors when both inputs are asserted, and the parallel NMOS transistors 81,83 serve to disengage the NMOS feedback transistors when both inputs are NULL.

FIG. 4a illustrates a symbol 87 for a three-input, threshold-two (two-of-three) NULL convention logic gate. The drawing conventions are the same as for FIG. 3a, but with three inputs A,B,C. When two of the three inputs is asserted, the output Z is asserted. After the output has been asserted, the output returns to NULL only when all inputs return to NULL FIG. 4b illustrates a symbol 91 for a four-input function gate (no hysteresis) with feedback. The output line 93 is fed back as an input. In isolation, the function gate operates as a threshold-2 gate without hysteresis. The output switches high when the number of high inputs is two or greater, and the output switches low when the number of high inputs is less than two. With feedback, the output signal Z becomes an input, and the circuit has the desired hysteresis. For example, after the output has been asserted and the number of asserted inputs drops to one, the feedback line provides a second asserted input to hold the majority function gate to an asserted output. The majority function gate 91 switches to NULL when all independent inputs A,B,C, become NULL.

Another way of understanding the operation of the gate of FIG. 4b is with an algebraic expression for the switching behavior. The function gate output should be asserted if any of the following conditions are true:

A and B are asserted;
A and C are asserted;
A and Z are asserted;
B and C are asserted;
B and Z are asserted;
C and Z are asserted.

This can be expressed in traditional boolean terms as:

$$f = (A*B) + (A*C) + (A*Z) + (B*C) + (B*Z) + (C*Z)$$

where "+" is the OR operator, and
where "*" is the AND operator.

The equation above can be re-written as:

$$f=(A+B)*(C+Z)+(A*B)+(C*Z).$$

Similarly, the majority function gate output should be NULL when it is not asserted. Stated algebraicly:

$$\bar{f} = \overline{(A+B)*(C+Z)+(A*B)+(C*Z)}$$

$$= \overline{A}*\overline{B}*(\overline{C}+\overline{Z})+\overline{C}*\overline{Z}*(\overline{A}+\overline{B})$$

FIG. 4c illustrates a transistor-level circuit diagram of a static CMOS implementation for gate of FIG. 4a. The circuit includes a pull-up sub-circuit 101, a pull-down sub-circuit 103 and an inverting driver 104 connected at a common signal junction 102. The pull-down sub-circuit 103 implements the function for generating an asserted output, expressed above as:

$$f=(A+B)*(C+Z)+(A*B)+(C*Z);$$

where the OR function is implemented with parallel transistors, and the AND function is implemented with serial transistors. When a condition of the function is met, the pull-down circuit 103 will connect the inverting driver input to ground, which results in an asserted output.

In the FIG. 4c, the (A+B) term is implemented with parallel NMOS transistors 105,107 having gates connected to input signal lines A and B, and having commonly connected sources and drains. The (C+Z) term is implemented with parallel NMOS transistors 109,111—one having a gate connected to input signal line C, and the other having a gate connected to feedback signal line Z. The NMOS transistors 109,111 have commonly connected sources and drains. The combined term (A+B)*(C+Z) is implemented by serially connecting the parallel transistor pairs for (A+B) and (C+Z) between the signal junction 102 and ground.

The term (C*Z) is implemented with NMOS transistors 113,115, with one having a gate connected the C input signal line and the other having a gate connected to the Z feedback signal line. The NMOS transistors 113,115 have sources and drains connected in series between the signal junction 102 and ground.

The term (A*B) is implemented by serially connecting sources and drains of NMOS transistors 117,119 between the signal junction 102 and ground, and by connecting the A input signal line to one gate, and the B input signal line to the other gate.

The overall function for the asserted output is implemented by parallel connection of the implementations of the three terms:

(A+B)*(C+Z), (A*B) and (C*Z)

The pull-up sub-circuit 101 is a similar implementation of the terms A*B*(C+Z) and C*Z*(A+B) discussed above. The term (A+B) is implemented through the parallel connection of two PMOS transistors 121,123 with gates connected to the A and B inputs. The term C*Z*(A+B)is implemented by the series connection of the implementation for (A+B) with two additional PMOS transistors 125,127 for the C and Z inputs.

In a similar fashion, the term A*B*(C+Z) is implemented by connecting two PMOS transistors 129,131 in parallel (for C and Z inputs), and connecting this parallel arrangement in series with two additional PMOS transistors 133,135 for the A and B inputs. The overall pull-up function is implemented by connecting implementations for individual terms in parallel between the voltage source V and the signal junction 102.

It should be apparent from the description above that a variety of transistor arrangements are possible for the two-of-three NULL convention gate by re-arranging terms of the algebraic expression to an equivalent expression. It should also be apparent that a wide variety of NULL convention gates can be made with varying numbers of inputs and varying threshold levels.

Figure 5A:
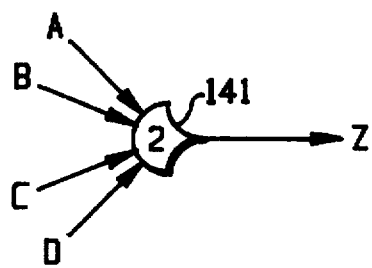
FIG. 5a illustrates a symbol for a four-input, threshold-two (two-of-four) NULL convention logic gate with two mutually exclusive assertion groups of two inputs each.

FIG. 5a illustrates a symbol 141 for a four-input, threshold-two (two-of-four) NULL convention logic gate with two mutually exclusive assertion groups of two inputs each. The drawing conventions are the same as for FIG. 3a, but with four inputs A,B,C,D. Here, the A and B inputs form a mutually exclusive assertion group, and the other two inputs C and D form a mutually exclusive assertion group. Thus, at most one of A and B will be asserted, and at most one of C and D will be asserted. After the output has been asserted, the output returns to NULL only when all inputs return to NULL.

Figure 5B:
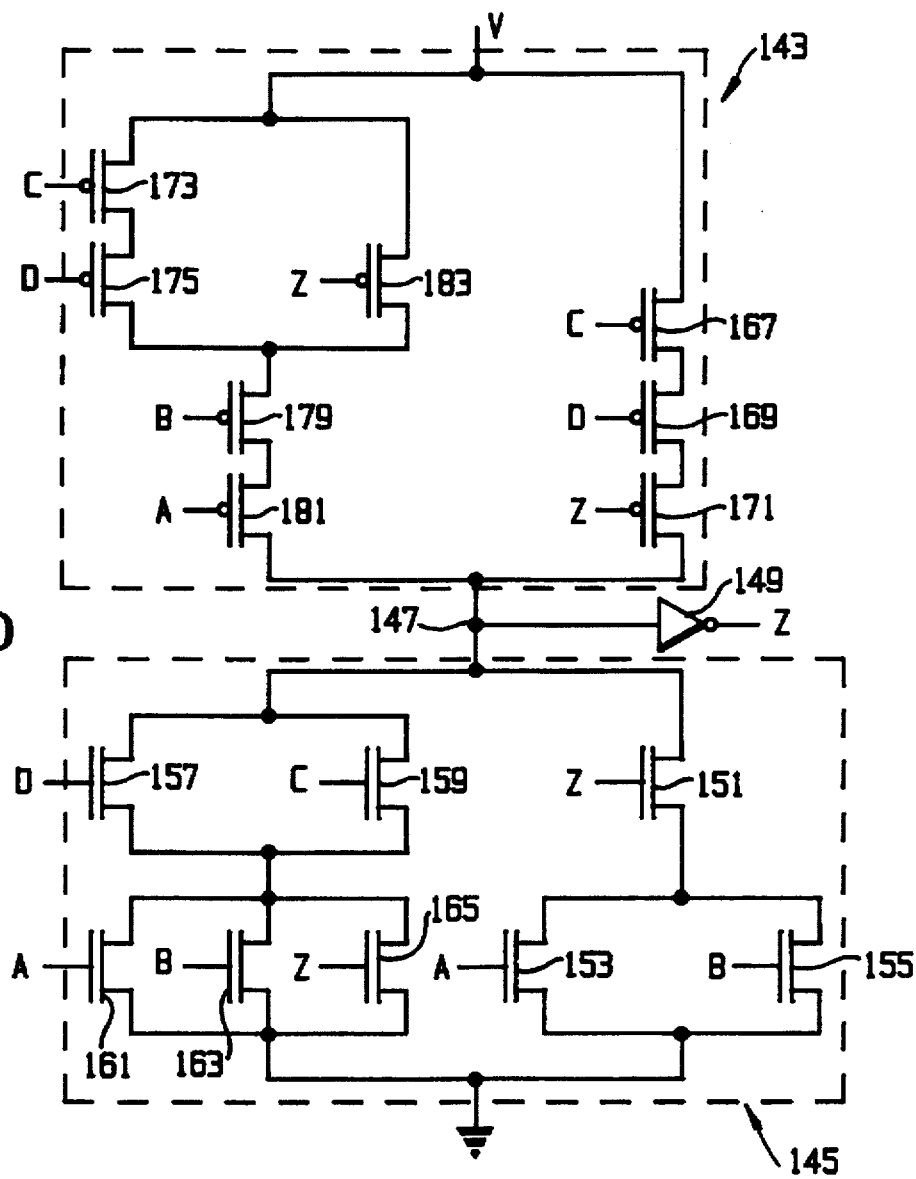

FIG. 5b illustrates a transistor-level circuit diagram of a static CMOS implementation for the gate of FIG. 5a. The circuit includes a pull-up sub-circuit 143, a pull-down sub-circuit 145, and an output driver 149. The pull-up sub-circuit 143 connects the input of the driver 149 to a voltage source V. The pull-down sub-circuit 145 connects the input of the driver 149 to ground. The pull-up sub-circuit 143, the pull-down sub-circuit 147 and the input of the driver 149 are commonly connected at a signal junction 147.

The presence of mutually exclusive assertion groups results in the following expression for asserting the gate output:

$$f=(A+B)*(C+D)+(A+B)*Z+(C+D)*Z$$

$$f=(A+B)*Z+(C+D)*(A+B+Z)$$

The term (A+B)*Z is implemented in the pull-down sub-circuit 145 as a NMOS transistor 151 connected to the parallel arrangement of NMOS transistors 153,155. The term (C+D),(A+B+Z) is implemented in the series connection of two parallel networks. Two parallel NMOS transistors 157,159 in the first network implement (C+D). Three parallel networks 161,163,165 in the second network implement (A+B+Z). The two parallel networks connect the signal junction 147 to ground.

The expression for the pull-up network 143 is the inverse of the expression for the pull down network 145 can be written as:

$$\bar{f} = \overline{(A+B)*Z+(C+D)*(A+B+Z)}$$

$$= (\overline{(A+B)}+\overline{Z}) * (\overline{(C+D)}+\overline{(A+B+Z)})$$

$$= (\overline{A}*\overline{B}+\overline{Z}) * (\overline{C}*\overline{D}+\overline{A}*\overline{B}*\overline{Z})$$

$$= \overline{A}*\overline{B}*\overline{C}*\overline{D}+\overline{A}*\overline{B}*\overline{Z}+\overline{C}*\overline{D}*\overline{Z}$$

$$= \overline{A}*\overline{B}*(\overline{C}*\overline{D}+\overline{Z})+\overline{C}*\overline{D}*\overline{Z}$$

The pull-up network implements the expression above as two parallel networks: a first network of three series transistors 167,169,171 with gates connected to inputs C and D and the feedback Z; a second network of five transistors 173,175,179,181,183, with four in series connected to inputs A,B,C and D, and a fifth 183 connected to the feedback Z and positioned in parallel with the C and D transistors.

Figure 6A:
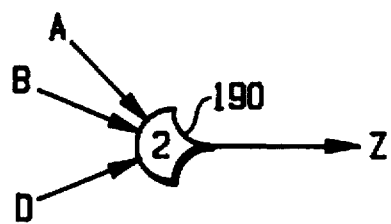
FIG. 6a illustrates a symbol for a three-input, threshold-two (two-of-three) NULL convention logic gate with one mutually exclusive assertion group of two inputs.

FIG. 6a illustrates a symbol 190 for a three-input, threshold-two (two-of-three) NULL convention logic gate with one mutually exclusive assertion group of two inputs A and B. The drawing conventions are the same as for FIG. 3a, but with three inputs A,B,D. The output Z will be asserted when one input of the mutually exclusive assertion group A,B is asserted and when either the third input D is asserted or when the output Z was asserted. After the output has been asserted, the output returns to NULL only when all inputs return to NULL.

Figure 6B:
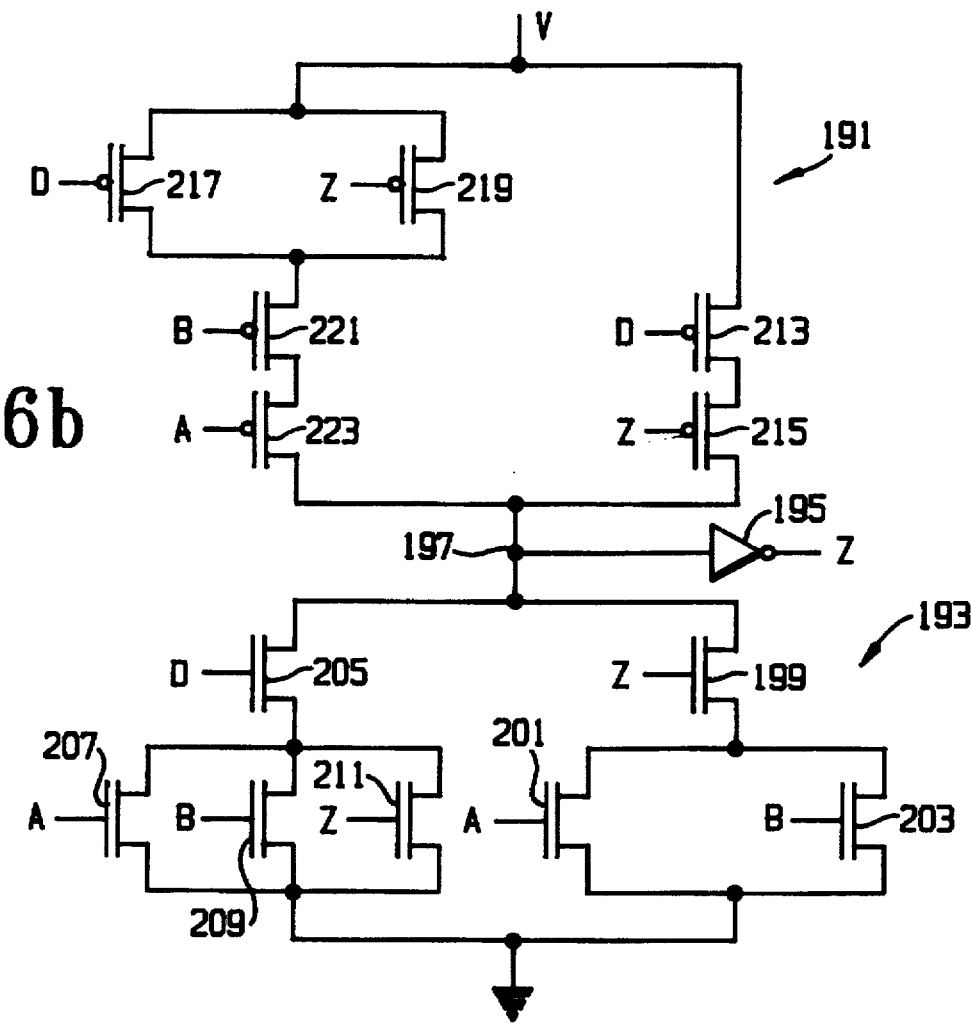

FIG. 6b illustrates a transistor-level circuit diagram of a static CMOS implementation for gate of FIG. 6a. The circuit includes a pull-up sub-circuit 191, a pull down sub-circuit 193 and an inverting driver 195 all connected to a common circuit junction 197.

The pull-down sub-circuit 193 implements a logic expression:

$$f=(A+B)*D+(A+B)*Z+D*Z$$

$$f=(A+B+Z)*D+(A+B)*Z$$

The term (A+B)*Z is implemented in the series connection of NMOS transistor 199 with the network formed by two parallel NMOS transistors 201,203. The parallel NMOS transistors have gates connected to the A and B inputs respectively, while the series NMOS transistor 199 has its gate connected to feedback Z.

The term (A+B+Z)*D is implemented with the series connection of an NMOS transistor 205 with a parallel network of three-transistors 207,209,211. The NMOS transistor 205 has its gate connected to input D. The three transistors 207,209,211 of the parallel network have gates connected to input signals A and B, and feedback signal Z. The networks implementing the two terms are connected in parallel between the signal junction 197 and ground.

The pull-up sub-circuit 191 implements the following logic expression:

$$\bar{f} = \overline{(A+B+Z)} * D + (A+B) * Z$$

$$= (\overline{(A+B+Z)} + \overline{D}) * (\overline{(A+B)} + \overline{Z})$$

$$= (\bar{A}*\bar{B}*\bar{Z} + \bar{D}) * (\bar{A}*\bar{B} + \bar{Z})$$

$$= \bar{A}*\bar{B}*\bar{Z} + \bar{A}*\bar{B}*\bar{D} + \bar{D}*\bar{Z}$$

$$= (\bar{A}*\bar{B})(\bar{D}+\bar{Z}) + \bar{D}*\bar{Z}$$

The term involving the AND of inverted D and Z signals is implemented by the series connection of two PMOS transistors 213,215. The term involving inverted A,B,D and feedback Z signals is implemented by the network formed by parallel transistor 217,219 (having gates connected to input signal D and feedback signal Z) which are collectively in series with two additional PMOS transistors 221,223 (having gates connected to input signals A and B). The networks implementing the two terms are connected in parallel between a voltage source V and signal junction 197. It will be appreciated that a variety of transistors can implement the gate.

Figure 7A:
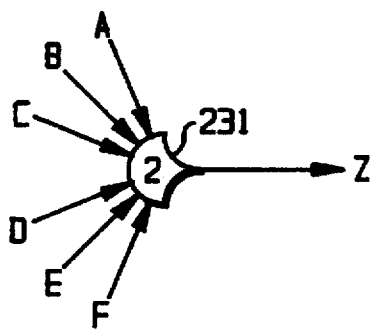
FIG. 7a illustrates a symbol for a six-input, threshold-two (two-of-six) NULL convention logic gate with two mutually exclusive assertion groups of three inputs each.

FIG. 7a illustrates a symbol 231 for a six-input, threshold-two (two-of-six) NULL convention logic gate with two mutually exclusive assertion groups of three inputs each. The drawing conventions are the same as for FIG. 3a, but with six inputs. The output Z will be asserted when one of the three inputs A,B,C, of the first mutually exclusive assertion group is asserted, and when one of the three inputs D,E,F of the second mutually exclusive assertion group is asserted. After the output has been asserted, the output returns to NULL only when all inputs return to NULL.

Figure 7B:
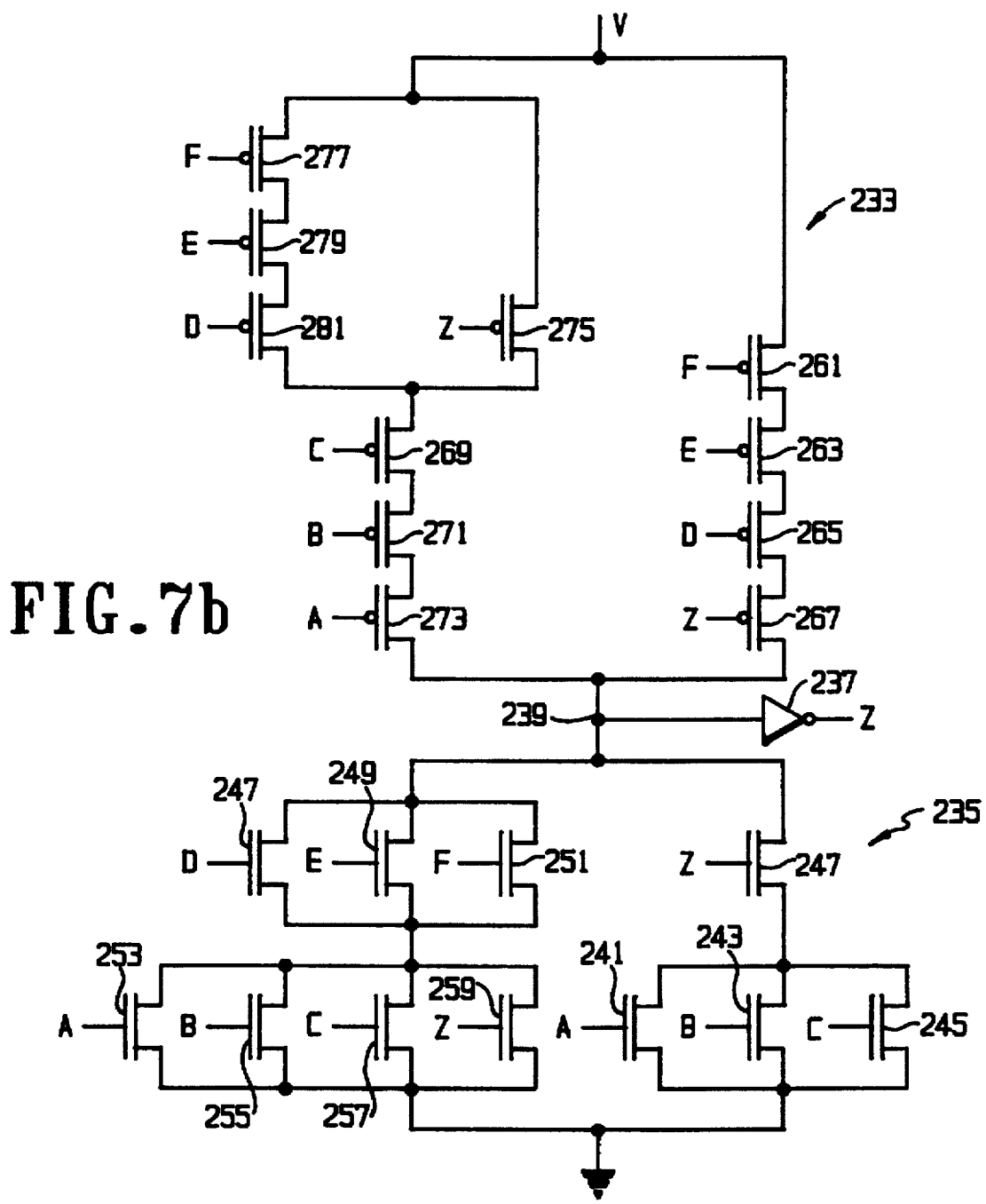

FIG. 7b illustrates a transistor-level circuit diagram of a static CMOS implementation for gate of FIG. 7a. The circuit includes a pull-up sub-circuit 233, a pull-down sub-circuit 235 and an inverting output driver 237, all connected at a common signal junction 239. The pull-down sub-circuit 235 implements logic for asserting the output, which is expressed as:

$$f=(A+B+C)*(D+E+F)+(A+B+C)*Z+(D+E+F)*Z$$

$$f=(A+B+C+Z)*(D+E+F)+(A+B+C)*Z$$

The term involving signals A, B, C, and Z is implemented by the parallel network of three NMOS transistors 241,243, 245 (each having a gate connected to input signals A,B,C), collectively in series with a single NMOS transistor 247 (having its gate connected to feedback signal Z). The term involving signals A, B, C, D, E, F, Z is implemented as two networks in series. The first network is a parallel arrangement of three NMOS transistors 247,249,251 having gates connected to signals D, E and F respectively. The second network is a parallel arrangement of four NMOS transistors 253,255,257,259 having gates connected to signals A, B, C and Z respectively. The separate implementations for the two terms are connected in parallel between the signal junction 239 and ground.

The pull-up sub-circuit 233 implements the logic expression:

$$\bar{f} = \overline{(A+B+C+Z)*(D+E+F)+(A+B+C)*Z}$$

$$= (\overline{(A+B+C+Z)} + \overline{(D+E+F)}) * (\overline{(A+B+C)} + \bar{Z})$$

$$= (\bar{A}*\bar{B}*\bar{C}*\bar{Z} + \bar{D}*\bar{E}*\bar{F}) * (\bar{A}*\bar{B}*\bar{C} + \bar{Z})$$

$$= \bar{A}*\bar{B}*\bar{C}*\bar{Z} + \bar{A}*\bar{B}*\bar{C}*\bar{D}*\bar{E}*\bar{F} + \bar{D}*\bar{E}*\bar{F}*\bar{Z}$$

$$= (\bar{A}*\bar{B}*\bar{C}) * (\bar{D}*\bar{E}*\bar{F} + \bar{Z}) + (\bar{D}*\bar{E}*\bar{F}*\bar{Z})$$

The term involving the AND of inverted signals D, E, F, and Z is implemented as the series connection of four PMOS transistors 261,263,265,267. The term involving inverted signals A, B, C, D, E, F and Z is implemented as the series connection of two networks. The first network is the series connection of three PMOS transistors 269,271,273 having gates connected to signals C, B and A, respectively. The second network is the parallel connection of a single PMOS transistor 275 (having its gate connected to the feedback signal Z), and a series of three PMOS transistors 277,279, 281 (having gates connected to signals F, E and D respectively). The implementations of the two terms are connected in parallel between a voltage source V and the signal junction 239.

Figure 8A:
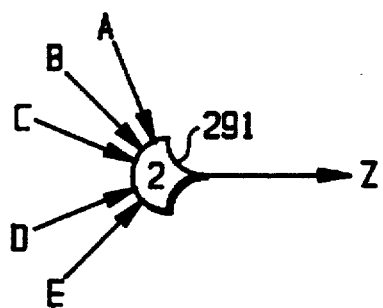
FIG. 8a illustrates a symbol for a five-input, threshold-two (two-of-five) NULL convention logic gate with two mutually exclusive assertion groups.

FIG. 8a illustrates a symbol 291 for a five-input, threshold-two (two-of-five) NULL convention logic gate with two mutually exclusive assertion groups, one having two inputs D,E and the other having three inputs A, B and C. The drawing conventions are the same as for FIG. 3a, but with five inputs A,B,C,D and E. The output Z will be asserted when:

1) one input of both mutually exclusive assertion groups is asserted; or
2) one input of one mutually exclusive assertion group is asserted and the output Z was asserted.

After the output has been asserted, the output returns to NULL only when all inputs return to NULL.

Figure 8B:
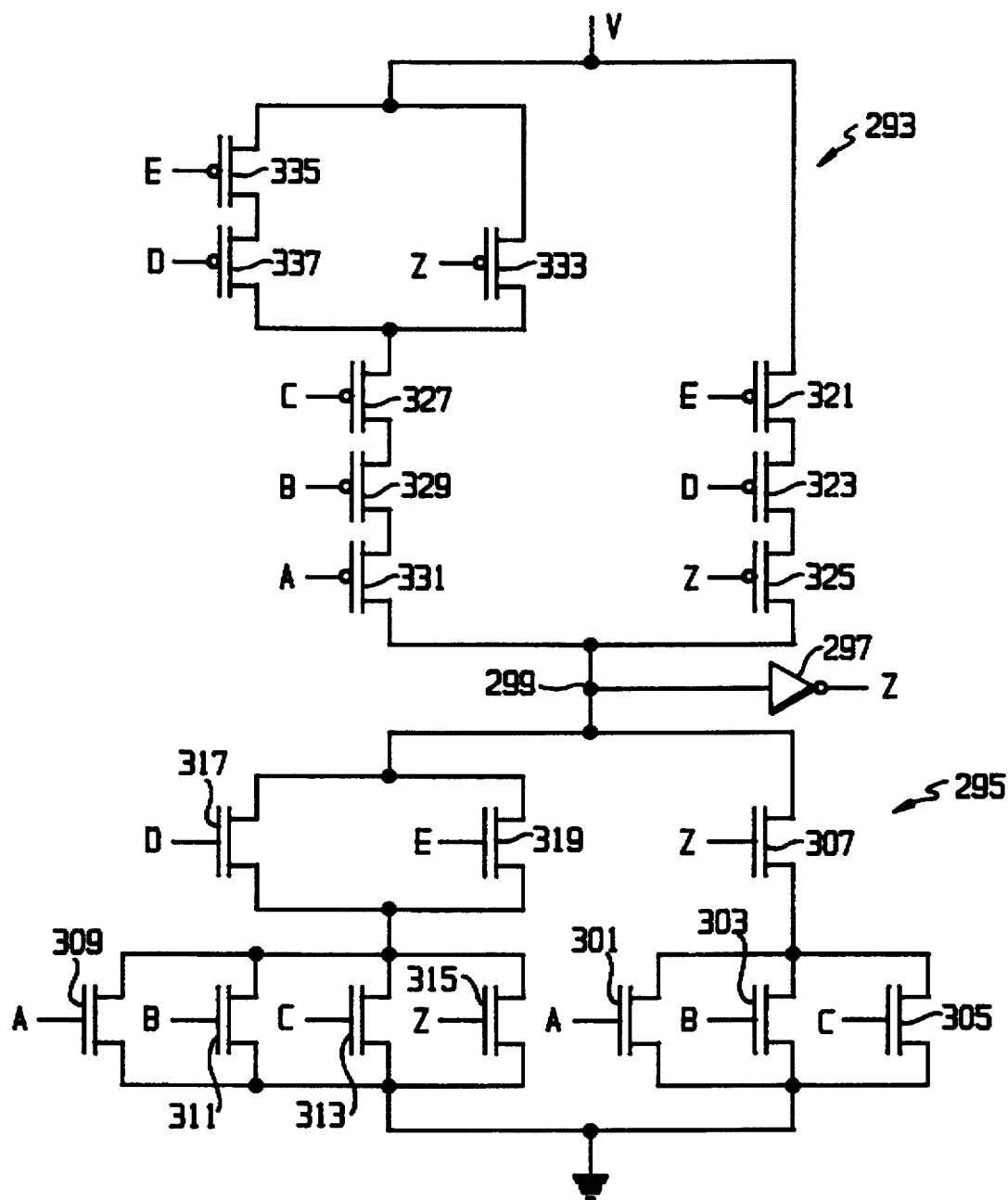

FIG. 8b illustrates a transistor-level circuit diagram of a static CMOS implementation for gate of FIG. 8a. The circuit includes a pull-up sub-circuit 293, a pull-down sub-circuit 295 and an inverting output driver 297, all connected at a common signal junction 299. The pull-down sub-circuit 295 implements logic for asserting the output, which is expressed as:

$$f=(A+B+C)*(D+E)+(A+B+C)*Z+(D+E)*Z$$

$$f=(A+B+C+Z)*(D+E)+(A+B+C)*Z$$

The term involving signals A, B, C, and Z is implemented by the parallel network of three NMOS transistors 301,303, 305 (each having a gate connected to input signals A,B,C), collectively in series with a single NMOS transistor 307 (having its gate connected to feedback signal Z). The term involving signals A, B, C, D, E, and Z is implemented by the series connection of two networks. The first network is the parallel connection of four NMOS transistors 309,311,313, 315 having gates connected to inputs A, B, C and feedback signal Z respectively. The second network is the parallel connection of two NMOS transistors 317,319 having gates connected to input signals D and E respectively. The separate implementations for the two terms are connected in parallel between the signal junction 299 and ground.

The pull-up sub-circuit 293 implements the logic expression:

$$\bar{f} = \overline{(A+B+C+Z)*(D+E)+(A+B+C)*Z}$$

$$= (\bar{A}*\bar{B}*\bar{C}*\bar{Z}+\bar{D}*\bar{E}) * (\bar{A}*\bar{B}*\bar{C}+\bar{Z})$$

$$= \bar{A}*\bar{B}*\bar{C}*\bar{Z} + \bar{A}*\bar{B}*\bar{C}*\bar{D}*\bar{E} + \bar{D}*\bar{E}*\bar{Z}$$

$$= (\bar{A}*\bar{B}*\bar{C}) * (\bar{Z}+\bar{D}*\bar{E}) + \bar{D}*\bar{E}*\bar{Z}$$

The term involving the AND of inverted signals E, D, and Z is implemented by the series connection of three PMOS transistors 321,323,325 having gates connected to signals E, D and Z respectively. The term involving inverted signals A, B, C, D, E and Z is implemented by the series connection of two networks. The first network is the series connection of three PMOS transistors 327,329,331 having gates connected to signals C, B and A respectively. The second network is a three-transistor arrangement of one PMOS transistor 333 (having a gate connected to the feedback signal Z), in parallel with a series connection of two PMOS transistors 335,337 (having gates connected to signals E and D respectively). The implementations of the two terms are connected in parallel between a voltage source V and the signal junction 299.

Figure 9A:
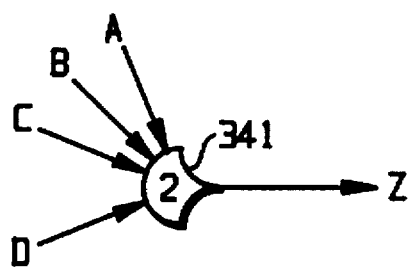
FIG. 9a illustrates a symbol for a four-input, threshold-two (two-of-four) NULL convention logic gate with a mutually exclusive assertion group having three inputs.

FIG. 9a illustrates a symbol 341 for a four-input, threshold-two (two-of-four) NULL convention logic gate with a mutually exclusive assertion group having three inputs A,B and C. The drawing conventions are the same as for FIG. 3a, but with four inputs A,B,C and D. The output Z will be asserted when:

1) one input of the mutually exclusive assertion group A,B,C is asserted and the fourth input D is asserted; or
2) one input of the mutually exclusive assertion group A, B, C is asserted and the output Z was asserted; or
3) the fourth input D is asserted and the output Z was asserted.

After the output has been asserted, the output returns to NULL only when all inputs return to NULL.

Figure 9B:
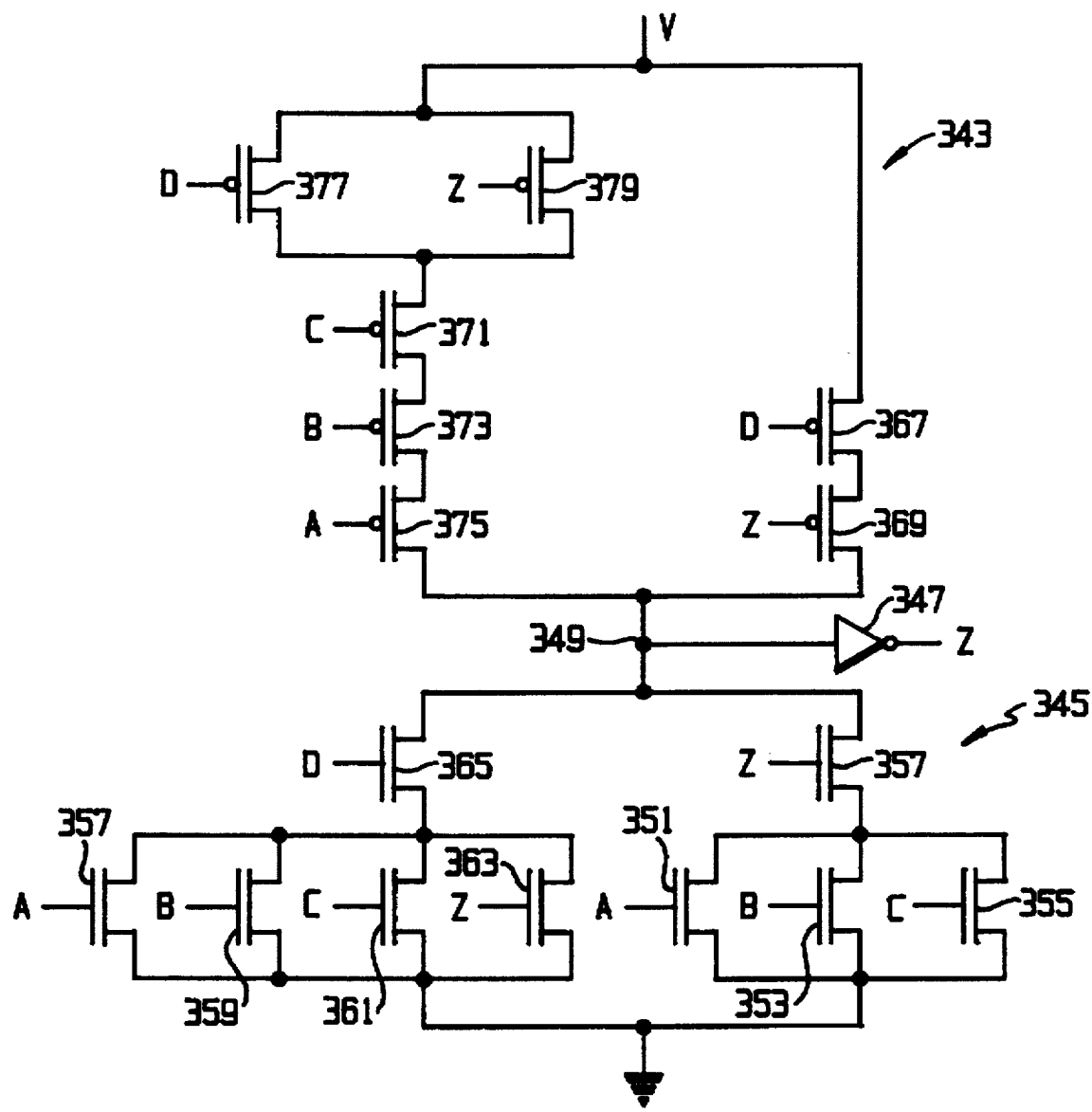

FIG. 9b illustrates a transistor-level circuit diagram of a static CMOS implementation for gate of FIG. 9a. The circuit includes a pull-up sub-circuit 343, a pull-down sub-circuit 345 and an inverting output driver 347, all connected at a common signal junction 349. The pull-down sub-circuit 345 implements logic for asserting the output, which is expressed as:

$$f=(A+B+C)*D+(A+B+C)*Z+D*Z$$

$$f=(A+B+C+Z)*D+(A+B+C)*Z$$

The term involving signals A, B, C, and Z is implemented by the parallel network of three NMOS transistors 351,353, 355 (each having a gate connected to input signals A,B,C), collectively in series with a single NMOS transistor 357 (having its gate connected to feedback signal Z). The term involving signals A, B, C and Z is implemented by the parallel network of four NMOS transistors 357,359,361,363 (having gates connected to signals A, B, C and Z respectively) in series with a single NMOS transistor 365 (having a gate connected to signal D). The separate implementations for the two terms are connected in parallel between the signal junction 349 and ground.

The pull-up sub-circuit 343 implements the logic expression:

$$\bar{f} = \overline{(A+B+C+Z)*D+(A+B+C)*Z}$$

$$= (\bar{A}*\bar{B}*\bar{C}*\bar{Z}+\bar{D}) * (\bar{A}*\bar{B}*\bar{C}+\bar{Z})$$

$$= \bar{A}*\bar{B}*\bar{C}*\bar{Z}+\bar{A}*\bar{B}*\bar{C}*\bar{D}+\bar{D}*\bar{Z}$$

$$= \bar{A}*\bar{B}*\bar{C}*(\bar{D}+\bar{Z})+\bar{D}*\bar{Z}$$

The term involving the AND of inverted signals D and Z is implemented by two series PMOS transistors 367,369 (each having a gate connected to input signals D an Z respectively). The term involving inverted signals A, B, C, D and Z is implemented by the series connection of two networks. The first network is the series connection of three PMOS transistors 371,373,375 (each having a gate connected to signal C, B and A, respectively). The second network is the parallel connection of two PMOS transistors 377,379 (each having a gate connected to signals D and Z respectively). The implementations of the two terms are connected in parallel between a voltage source V and the signal junction 349.

Figure 10A:
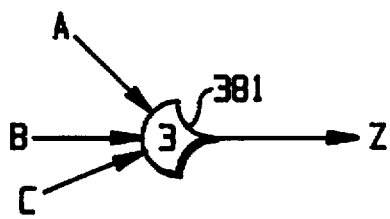
FIG. 10a illustrates a symbol for a three-input, threshold-three (three-of-three) NULL convention logic gate.

FIG. 10a illustrates a symbol 381 for a three-input, threshold-three (three-of-three) NULL convention logic gate (no mutually exclusive assertion groups). The drawing conventions are the same as for FIG. 3a, but with three inputs A,B and C. The output Z will be asserted when:

1) all three inputs A, B and C are asserted; or
2) any two of the inputs A, B, and C are asserted and the output Z was asserted; or 3) any one of the inputs A, B, and C is asserted and the output Z was asserted.

Condition two is a subset of condition three. That is, if condition two is met, condition three is met. After the output has been asserted, the output returns to NULL only when all inputs return to NULL.

Figure 10B:
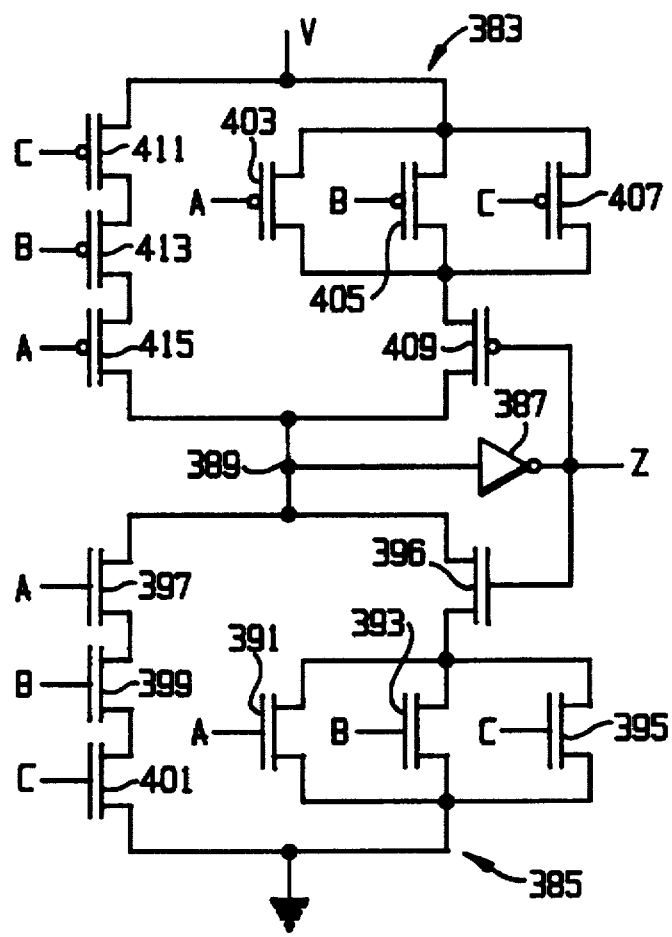

FIG. 10b illustrates a transistor-level circuit diagram of a static CMOS implementation for gate of FIG. 10a. The circuit includes a pull-up sub-circuit 383, a pull-down sub-circuit 385 and an inverting output driver 387, all connected at a common signal junction 389. The pull-down sub-circuit 385 implements logic for asserting the output, which is expressed as:

$$f=(A*B*C)+(A*B*Z)+(A*C*Z)+(B*C*Z)+(A+B+C)*Z$$

$$f=(A*B*C)+(A+B+C)*Z$$

The term involving signals A, B, C and Z is implemented by the parallel connection of three NMOS transistors 391, 393,395 (each having a gate connected to input signals A, B and C respectively), collectively in series with a single NMOS transistor 396 (having a gate connected to feedback signal Z). The term involving the AND of signals A, B and C is implemented by the series connection of three NMOS transistors 397,399,401 (each having a gate connected to input signals A, B and C, respectively). The separate implementations for the two terms are connected in parallel between the signal junction 389 and ground.

The pull-up sub-circuit 383 implements the logic expression:

$$f = \overline{(A*B*C) + (A+B+C)*Z}$$

$$= (\overline{A} + \overline{B} + \overline{C}) * (\overline{A*B*C} + \overline{Z})$$

$$= \overline{A}*\overline{B}*\overline{C} + \overline{Z}*(\overline{A}+\overline{B}+\overline{C})$$

The term involving inverted signals A, B, C and Z is implemented by the parallel network of three PMOS transistors 403,405,407 (each having a gate connected to input signals A, B, and C respectively), collectively in series with a single PMOS transistor 409 (having its gate connected to feedback signal Z). The term involving the AND of inverted signals A, B and C is implemented by the series connection of three PMOS transistors 411,413,415. The implementations of the two terms are connected in parallel between a voltage source V and the signal junction 389.

Figure 11A:
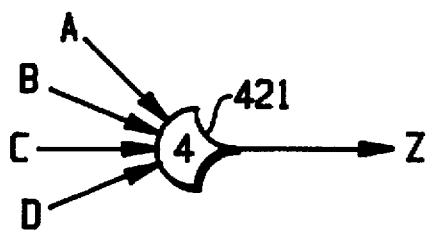
FIG. 11a illustrates a symbol for a four-input, threshold-four (four-of-four) NULL , convention logic gate.

FIG. 11a illustrates a symbol 421 for a four-input, threshold-four (four-of-four) NULL convention logic gate with four inputs (no mutually exclusive assertion groups). The drawing conventions are the same as for FIG. 3a, but with four inputs A,B,C and D. The output Z will be asserted when:

1) all four inputs A, B, C and D are asserted; or
2) any three of the inputs A, B, C, and D are asserted and the output Z was asserted;
3) any two of the inputs A, B, C and D are asserted and the output Z was asserted; or
4) any one of the inputs A, B, C and D is asserted and the output Z was asserted.

The second and third conditions above are subsets of condition four. That is, if either of conditions two or three is met, then condition four is met. After the output has been asserted, the output returns to NULL only when all inputs return to NULL.

Figure 11B:
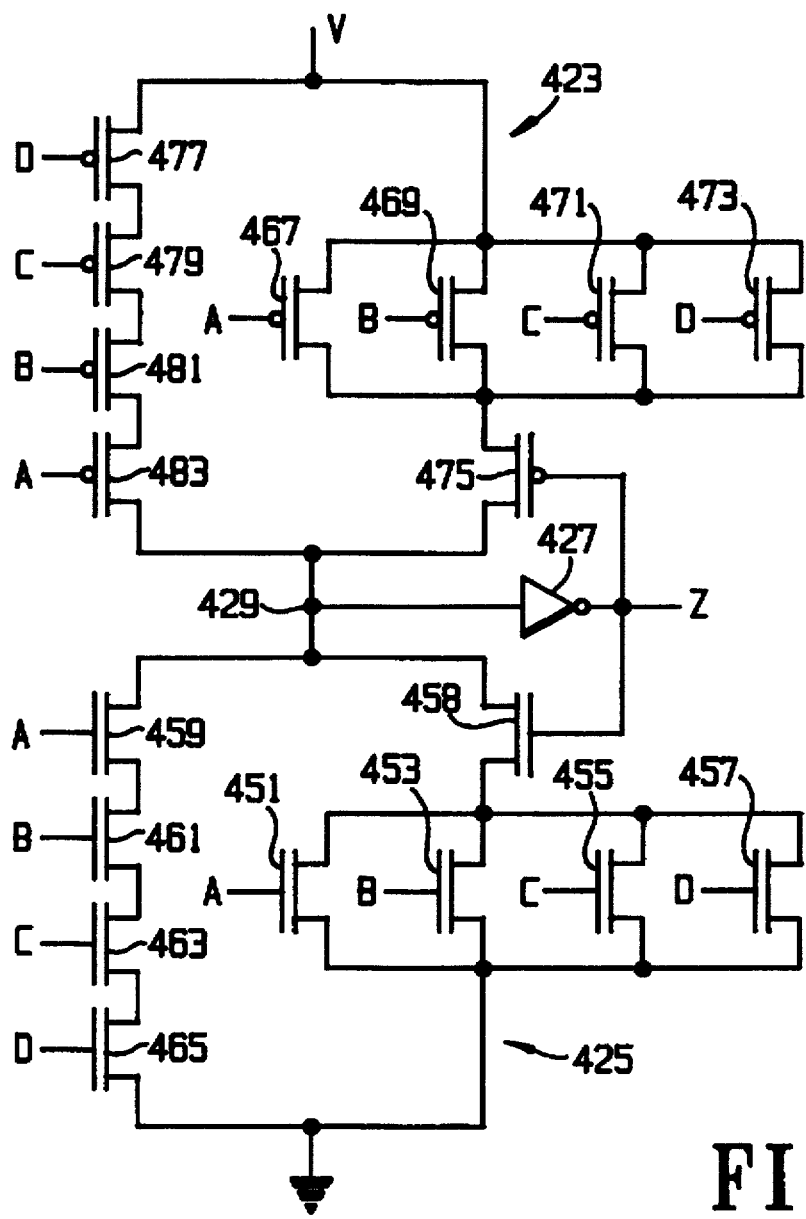

FIG. 11b illustrates a transistor-level circuit diagram of a static CMOS implementation for gate of FIG. 11a. The circuit includes a pull-up sub-circuit 423, a pull-down sub-circuit 425 and an inverting output driver 427, all connected at a common signal junction 429. The pull-down sub-circuit 425 implements logic for asserting the output, which is expressed as:

$$f=(A*B*C*D)+Z*(A+B+C+D)$$

The term involving signals A, B, C, D and Z is implemented by the parallel network of four NMOS transistors 451,453,455,457 (each having a gate connected to input signals A,B,C or D), collectively connected in series with a single NMOS transistor 458 (having its gate connected to feedback signal Z). The term involving the AND of signals A, B, C, and D is implemented by the serial network of four NMOS transistors 459,461,463,465, each having a gate connected to signal A, B, C and D respectively. The separate implementations for the two terms are connected in parallel between the signal junction 429 and ground.

The pull-up sub-circuit 423 implements the logic expression:

$$f = \overline{(A*B*C*D) + Z*(A+B+C+D)}$$

$$= (\overline{A} + \overline{B} + \overline{C} + \overline{D}) * (\overline{Z} + \overline{A*B*C*D})$$

$$= \overline{A}*\overline{B}*\overline{C}*\overline{D} + \overline{Z}*(\overline{A}+\overline{B}+\overline{C}+\overline{D})$$

The term involving the OR of inverted signals A, B, C, and D is implemented by the parallel network of four PMOS transistors 467,469,471,473 (each having a gate connected to input signals A,B,C and D), collectively in series with a single PMOS transistor 475 (having its gate connected to feedback signal Z). The term involving the AND of inverted signals A, B, C, and D is implemented by the series connection of four PMOS transistors 477,479,481,483. The implementations of the two terms are connected in parallel between a voltage source V and the signal junction 429.

Figure 12A:
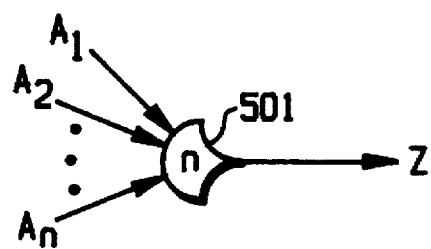
FIG. 12a illustrates a symbol for an n-input, threshold-n (n-of-n) NULL convention logic gate.

FIG. 12a illustrates a symbol 501 for an n-input, threshold-n (n-of-n) NULL convention logic gate with n inputs. The drawing conventions are the same as for FIG. 3a, but with a variable number of inputs A1, A2, . . . An. The output Z will be asserted when:

1) all inputs A1, A2 . . . An are asserted; or
2) any combination of the inputs A1, A2, . . . An are asserted and the output Z was asserted; or
3) any one of the inputs A1, A2, . . . An is asserted and the output Z was asserted.

Condition two is a subset of condition three. That is, if condition two is met, condition three is met. After the output has been asserted, the output returns to NULL only when all inputs return to NULL. This can be recognized as a generalization of the series of gates shown in FIGS. 3a (two-of-two), 10a (three-of-three), and 11a (four-of-four).

Figure 12B:
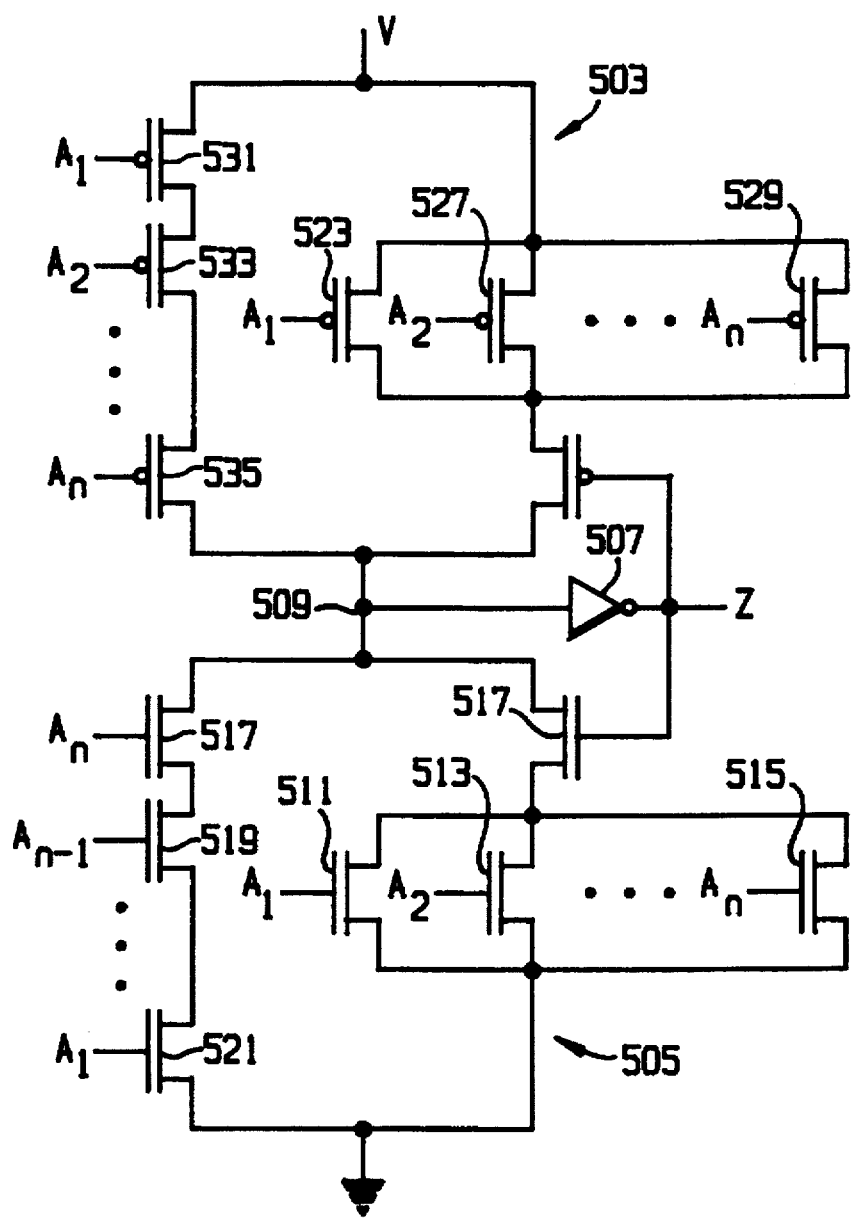

FIG. 12b illustrates a transistor-level circuit diagram of a static CMOS implementation for gate of FIG. 12a. The circuit includes a pull-up sub-circuit 503, a pull-down sub-circuit 505 and an inverting output driver 507, all connected at a common signal junction 509. The pull-down sub-circuit 505 implements logic for asserting the output, which is expressed as:

$$f=(A1*A2* \ldots *An)+(A1+A2+ \ldots +An)*Z$$

The term involving the OR of A1, A2, . . . An is implemented by the parallel network of n NMOS transistors 511,513, . . . , 515 (each having a gate connected to input signals A1,A2, . . . , An), collectively in series with a single NMOS transistor 517 (having its gate connected to feedback signal Z). The term involving the AND of A1, A2, . . . An is implemented by the series connection of n NMOS transistors 517,519, . . . , 521, each having a gate connected to input signals A1,A2 . . . , An. The separate implementations for the two terms are connected in parallel between the signal junction 509 and ground.

The pull-up sub-circuit 503 implements the logic expression:

$$\overline{(\overline{A_1}*\overline{A_2}* \ldots *\overline{A_n})+\overline{Z}*\overline{(A_1+A_2+ \ldots +A_n)}}$$

The term involving the OR of inverted signals A1, A2, . . . An is implemented by the parallel network of n PMOS transistors 523,527, . . . , 529, each having a gate connected to input signals A1,A2, . . . ,An. The term involving the AND of inverted signals A1, A2, . . . An is implemented by the series connection of n NMOS transistors 531,533, . . . , 535, each having a gate connected to input signals A1,A2 . . . , An. The separate implementations for the two terms are connected in parallel between the voltage source V and the common signal junction 509. Trapezoidal scaling of series chains can be used to reduce delays. For very large values of n, a tree of these gates can be used.

Figure 13:
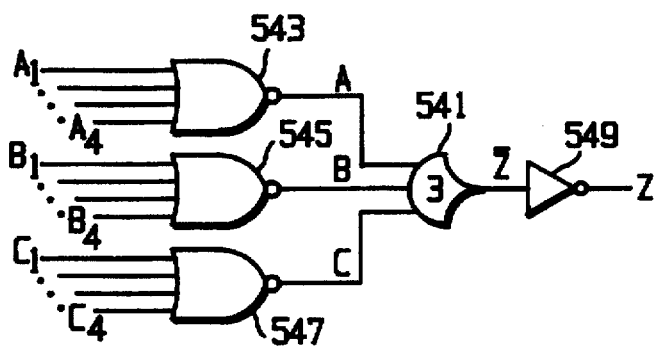
FIG. 13 illustrates a first generalized gate implementation for a threshold-three gate.

FIG. 13 illustrates a first generalized gate implementation for a threshold three gate having three mutually exclusive assertion groups of four inputs each. It includes a three-of-three gate 541 receiving an input from each of three traditional boolean NOR gates 543,545,547. Each of three traditional boolean NOR gates 543,545,547 in turn receives inputs from a mutually exclusive assertion group A1 . . . A4, B1 . . . B4, C1 . . . C4. The use of four-signal mutually exclusive assertion groups is exemplary. The number of mutually exclusive assertion groups, and the number of signal lines per mutually exclusive assertion groups can be selected according circuit design requirements. An inverting output driver 549 preservers the convention of asserting an output by driving the line to a positive voltage, and a line being NULL at the ground voltage.

Figure 14:
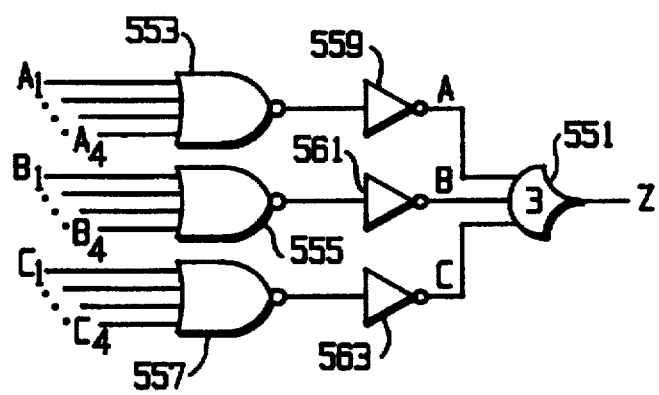
FIG. 14 illustrates a second generalized gate implementation for a threshold-three gate.

FIG. 14 illustrates a second generalized gate implementation for a threshold three gate having three mutually exclusive assertion groups of four inputs each. It includes a three-of-three gate 551 receiving inputs from three traditional Boolean OR gates. Here, the Boolean OR gates are implemented as Boolean NOR gates 553,555,557 having inverters 559,561,563 at their outputs. Each of three traditional boolean NOR gates 553,555,557 in turn receives inputs from a mutually exclusive assertion group A1 . . . A4, B1 . . . B4, C1 . . . C4. Again, the use of four-signal mutually exclusive assertion groups is exemplary. The number of mutually exclusive assertion groups, and the number of signal lines per mutually exclusive assertion groups can be selected according circuit design requirements.

From inspection, the implementation of FIGS. 13 maybe preferred because it uses two less inverters. In addition, the inverter 549 can provide additional fan-out drive capacity.

Figure 15:
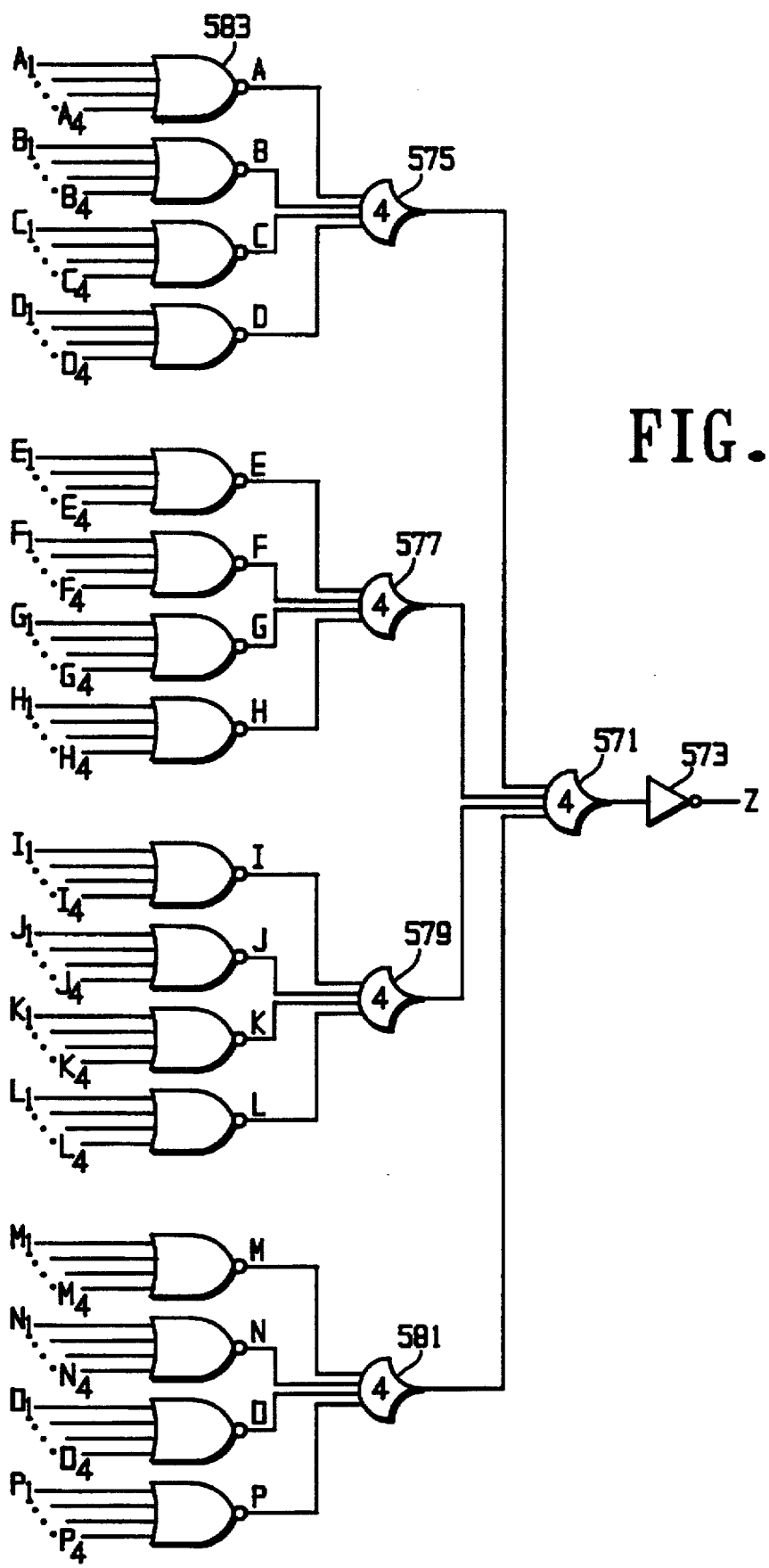
FIG. 15 illustrates a generalized gate implementation for a threshold-sixteen gate having sixteen mutually exclusive assertion groups.

FIG. 15 illustrates a generalized gate implementation for a threshold sixteen gate having sixteen mutually exclusive assertion groups and an extremely large number (sixty four) of inputs. A terminal four-of-four gate 571 and inverter 573 provide the circuit output similarly to the three-of-three gate 541 and inverter 549 of FIG. 13. Each input to the terminal four-of-four gate 571 is derived from the output of one of four intermediate four-of-four gates 575,577,579,581. Each of the intermediate four-of-four gates 575,577,579,581 receives outputs (A,B,C,D), (E,F,G,H), (I,J,K,L), (M,N,O,P) from four Boolean NOR gates 583. Each Boolean NOR gate in turn receives inputs from four signal lines. The number NOR gates and the number of lines per gate can be varied as required. For mutually exclusive assertion groups of large numbers of lines, additional Boolean or NULL convention gating can be used.

Figure 16A:
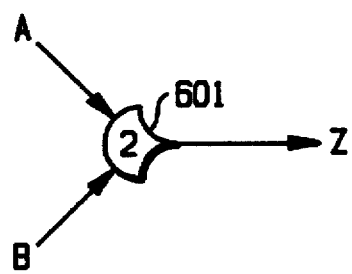
FIG. 16a illustrates a symbol for a two-input threshold-two gate (two-of-two)

FIG. 16a illustrates a symbol 601 for a two-input threshold-two gate (two-of-two). It is functionally the same as the two-of-two gate illustrated in FIG. 3a.

Figure 16B:
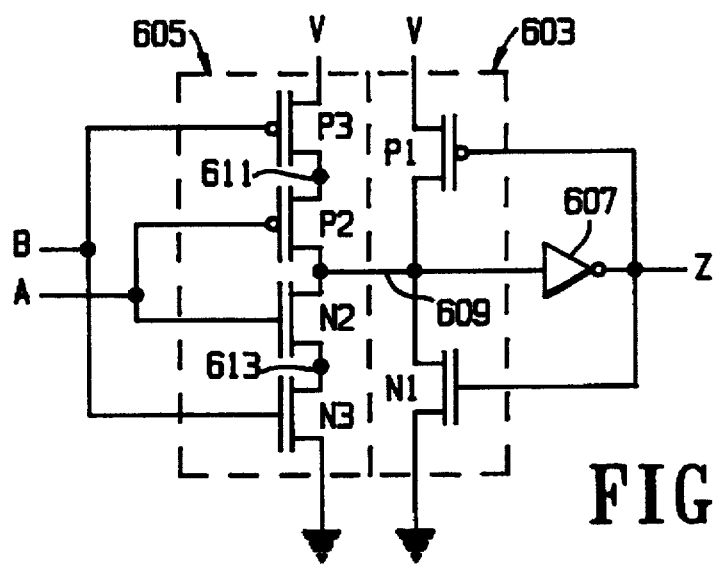

FIG. 16b illustrates a transistor-level circuit diagram of a semi-static CMOS implementation for gate of FIG. 16a. The circuit includes first and second sets of complementary transistors 603,605 and an inverting output driver 607 connected at a common signal junction 609. The first set of transistors 603 includes a first PMOS transistor P1 connected between a voltage source and the common signal junction 609, and also includes a first NMOS transistor N1 connected between the common signal junction 609 and ground. The output of the inverting output driver 607 connects to the gates of the first PMOS transistor P1 and of the first NMOS transistor N1.

The second set of transistors 605 includes second and third PMOS transistors P2,P3 connected in series between the voltage source V and the common signal junction 609, and also includes second and third NMOS transistors N2,N3 connected in series between the common signal junction 609 and ground. One input signal A connects to gates of one PMOS transistor P2 and one NMOS transistor N2. The other input signal B connects to gates of the other PMOS transistor P3 and the other NMOS transistor N3. The transistors of the first set 603 are weak compared to the transistors of the second set 605 as discussed more fully below.

Operation of the circuit will be described by following a series of input transitions. Initially, inputs A and B are NULL. Second and third NMOS transistors N2,N3 are off. Second and third PMOS transistors P2,P3 are on, which pulls the common signal junction 609 to the voltage reference V. The input to the inverting output driver 607 is "high," and the output Z is NULL. The first NMOS transistor N1 is off (because its gate is "low"), and the first PMOS transistor is on. All three PMOS transistors P1,P2,P3 pull the signal junction 609 high, and the circuit is in a stable state.

When one of the two inputs becomes asserted, while the other is NULL, the circuit output does not change. If input A, for example, is asserted, the second PMOS transistor P2 switches off, and the third NMOS transistor N3 switches on. With one PMOS transistor of the second set OFF, and one NMOS transistor of the second set OFF, the common signal junction 609 is isolated except for the weak PMOS transistor P1 which holds the common signal junction HIGH. The same result occurs when input B is asserted and input A remains NULL.

When both inputs become asserted, the second and third PMOS transistors P2,P3 are off and the second and third NMOS transistors N2,N3 are on. The second and third NMOS transistors N2,N3 pull the common signal junction 609 low, which causes the inverting output driver 607 to assert the output Z. The first PMOS transistor P1 will switch off, and the first NMOS transistor N1 will switch on. All three NMOS transistors N1,N2,N3 pull the signal junction 609 low, and the circuit is in a stable state. For a brief period, the first PMOS transistor P1 will be on (because the output was initially NULL) and the second and third NMOS transistors (because the inputs have been asserted). The stronger NMOS transistors will dominate the weak PMOS transistor, and the common signal junction will be pulled low.

When one input returns to NULL, the circuit output does not change. One of the second and third PMOS transistors P2,P3 will switch on, and one of the second and third NMOS transistors N2,N3 will switch off. The first (weak) NMOS transistor N1 is still on (because the output is asserted), and the common signal junction 609 remains low.

When both inputs return to NULL, the circuit returns to it initial state with all PMOS transistors P1,P2,P3 on and all NMOS transistors N1,N2,N3 off. For a brief period of time, the weak first NMOS transistor N1 will be on and in competition with the strong second and third PMOS transistors P2,P3, but the strong second and third PMOS transistors P2,P3 will pull the common signal junction 609 high. Thus, the term "weak" means that the second set of transistors 605 can pull the common signal junction 609 across the switching threshold of the inverting output driver 607, even against the opposing action of one of the weak transistors of the first set 603. For example, W/L (width/length) for the first PMOS transistor P1 can be much smaller than W/L for the second and third PMOS transistors P2,P3. The first NMOS transistor N1 is similarly weak compared to second and third NMOS transistors N2,N3.

In this semi-static gate implementation, the feedback signal Z is not returned as an input as other signal inputs. Instead, the feedback signal Z turns on and off the "keeper" devices formed by the weak transistors. Without the weak transistors, the common signal junction 609 would be isolated when one input is asserted and the other input is NULL.

It should be noted that the common signal junction 609 will have a relatively high parasitic capacitance relative to the junction 611 between second and third PMOS transistors P2,P3 and the junction 613 between the second and third NMOS transistors N2,N3. The common signal junction 609 will connect several source and/or drain regions, typically with metal or poly-silicon interconnects. The other junctions 611,613 may be merely a shared source/drain diffusion region. When only one input is asserted, either the second PMOS transistor P2 will be off, or the second NMOS transistor N2 will be off. At this time, there may be charge sharing between the common signal junction 609 and one of the other junctions 611,613. The operation of the weak transistors P1,N1 will cancel any unwanted charge, but this restoring action may slow the switching time of the overall circuit and should be considered when sizing the weak devices.

FIG. 17a illustrates a symbol 621 for a three-input threshold-two gate (two-of-three). It is functionally the same as the two-of-three gate illustrated in FIG. 4a.

FIG. 17b illustrates a transistor-level circuit diagram of a semi-static CMOS implementation for the gate of FIG. 17a. The circuit includes a pull-up sub-circuit 623, a pull-down sub-circuit 625, a first PMOS "keeper" transistor 627, a first NMOS "keeper" transistor 629 and an inverting output driver 631 all connected at a common signal junction 633.

The pull-down sub-circuit 625 implements the logic for asserting the output Z. The output should be asserted if either:

1) A and B are asserted; or
2) B and C are asserted; or
3) A and C are asserted; or
4) any one of A,B or C is asserted and the output Z was asserted.

The first condition is implemented by first and second NMOS transistors 635,637, the first 635 having a gate connected to signal A, the second 637 having a gate connected to signal B, both having connected in series between the common signal junction 633 and ground. The second condition is implemented by third and fourth NMOS transistors 639,641 connected in series between the common signal junction 633 and ground. The third condition is implemented by fifth and sixth NMOS transistors 643,645 connected between the common signal junction 633 and ground.

The third condition is implemented by a seventh "keeper" NMOS transistor 629. As with the circuit shown in FIG. 16, the output Z is not used as a separate logic input, but to control a weak device which prevents the circuit from switching when the common signal junction 633 otherwise would be isolated.

The pull-up sub-circuit 623 includes first, second and third PMOS transistors 653,655,657 connected in series, each connected to one of the inputs A,B or C. When all three inputs are NULL, the three PMOS transistors 653,655,657 switch on, pulling the common signal junction 633 high and causing the inverting output driver 631 to generate a NULL output. When one or two of the inputs is NULL, the keeper transistors 627,629 prevent the common signal junction 633 from being isolated and hold the circuit in the previous state.

Note that the first, third and fifth NMOS transistors 635,639,643 connect directly to the common signal junction. The A input connects to one and only one of these three transistors, the B input connects to one and only one, and the C input connects to one and only one. This arrangement minimizes the charge sharing between junctions 647,649, 651 and the common signal junction 633.

Figure 18A:
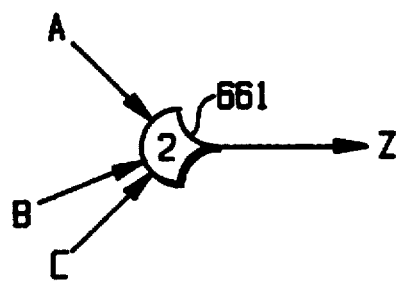
FIG. 18a illustrates a symbol for a three-input threshold-two gate (two-of-three) with a two-input mutually exclusive assertion group.

FIG. 18a illustrates a symbol 661 for a three-input threshold-two gate (two-of-three) with a two-input mutually exclusive assertion group. It is functionally the same as the two-of-three gate shown in FIG. 6a, except that input signal names are different.

Figure 18B:
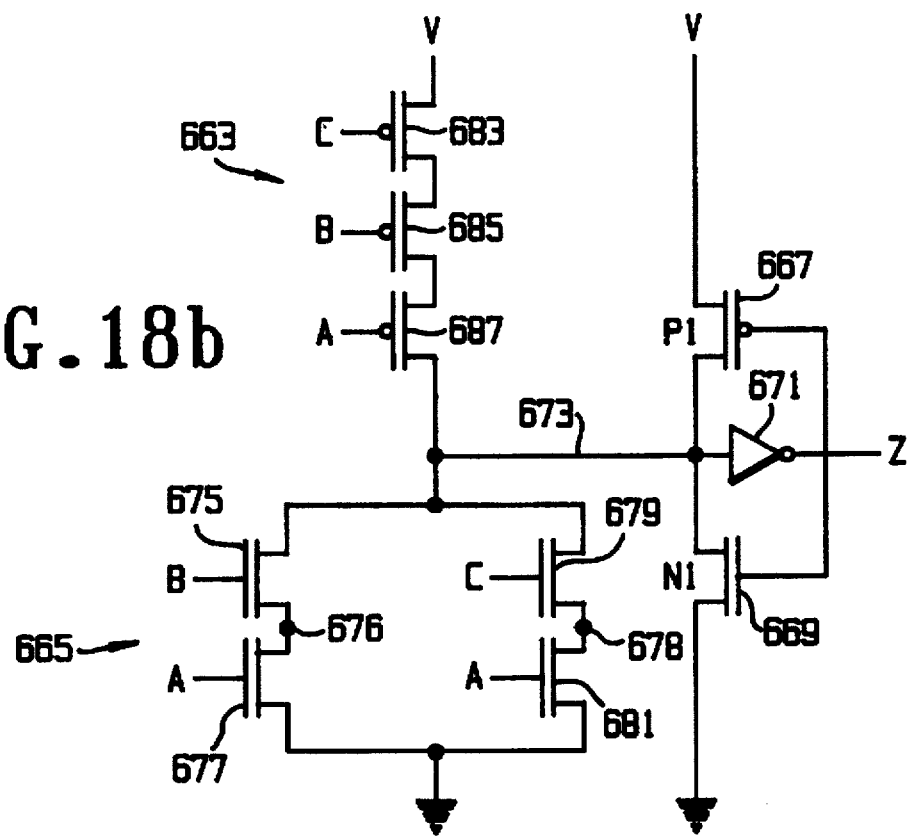

FIG. 18b illustrates a transistor-level circuit diagram of a semi-static CMOS implementation for gate of FIG. 18a. The circuit includes a pull-up sub-circuit 623, a pull-down sub-circuit 665, a first PMOS "keeper" transistor 667, a first NMOS "keeper" transistor 669 and an inverting output driver 671 all connected at a common signal junction 673.

The pull-down sub-circuit 665 implements the logic for asserting the output Z. The presence of the mutually exclusive assertion group simplifies the circuit, because only one of inputs B and C will be asserted at a time. The output should be asserted if either:

1) A is asserted and B is asserted; or
2) A is asserted and C is asserted; or
3) one of A, B and C is asserted and the output Z was asserted.

The first condition is implemented by first and second NMOS transistors 675,677, the first 675 having a gate connected to signal B, the second 677 having an input connected to signal A, both connected in series between the common signal junction 673 and ground. The second condition is implemented by third and fourth NMOS transistors 679,681 connected in series between the common signal junction 673 and ground.

The third condition is implemented by a fifth "keeper" NMOS transistor 669. As with the circuits shown in FIGS. 16 and 17, the output Z is not used as a separate logic input, but to control a weak device preventing the circuit from switching when the common signal junction 673 otherwise would be isolated.

The pull-up sub-circuit 663 includes first, second and third PMOS transistors 683,685,687 connected in series, each connected to one of the inputs A,B or C. When all three inputs are NULL, the three PMOS transistors 683,685,687 switch on, pulling the common signal junction 673 high and causing the inverting output driver 671 to generate a NULL output. When one or two of the inputs is NULL, the keeper transistors 667,669 prevent the common signal junction 673 from being isolated and holds the circuit in the previous state.

Note that the first and third NMOS transistors 675,679 connect directly to the common signal junction. The A input connects to one and only one of these three transistors and the B input connects to one and only one. This arrangement minimizes the charge sharing between junctions 676,678 and the common signal junction 673.

Figure 19A:
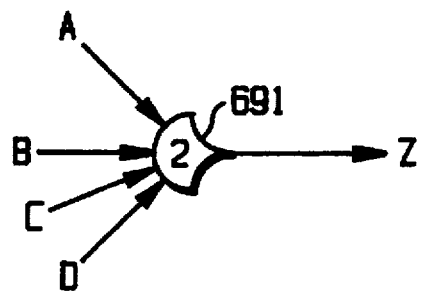
FIG. 19a illustrates a symbol for a four-input threshold-two gate (two-of-four) with a three-input mutually exclusive assertion group.

FIG. 19a illustrates a symbol 691 for a four-input threshold-two gate (two-of-four) with a three-input mutually exclusive assertion group. It is functionally the same as the two-of-three gate shown in FIG. 9a, except that input signal names have been rearranged.

Figure 19B:
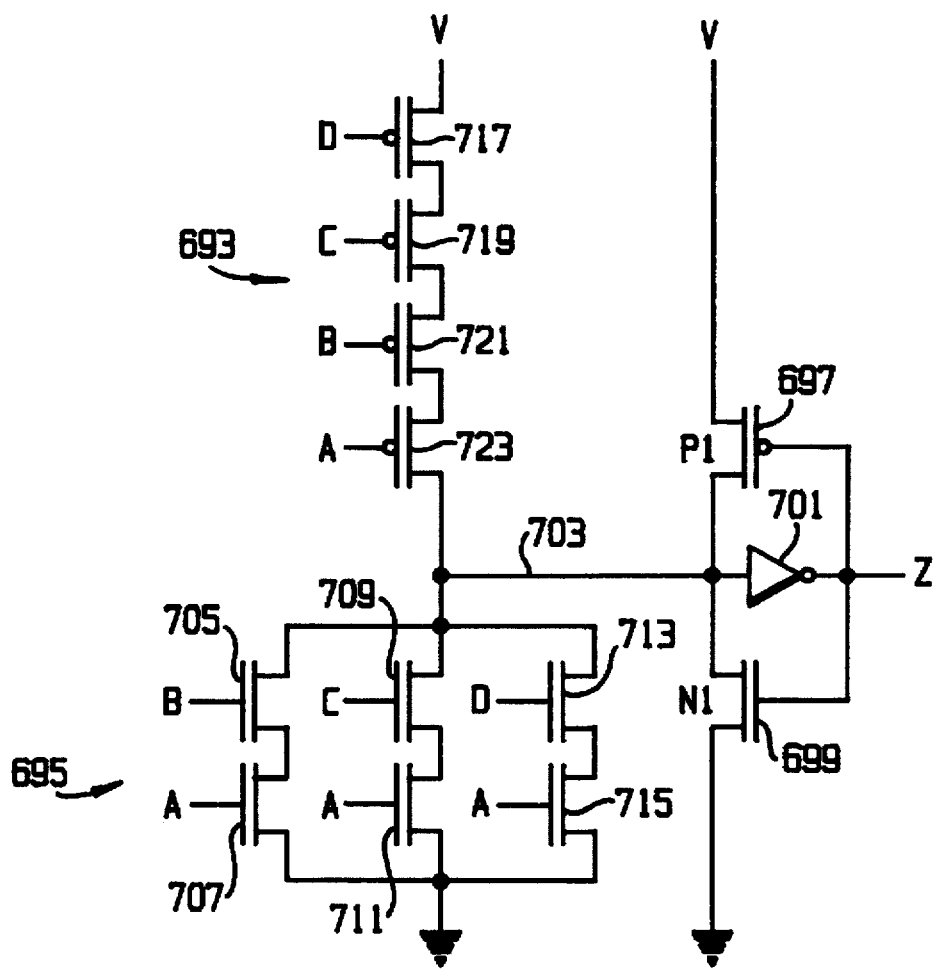

FIG. 19b illustrates a transistor-level circuit diagram of a semi-static CMOS implementation for gate of FIG. 19a. The circuit includes a pull-up sub-circuit 693, a pull-down sub-circuit 695, a first PMOS "keeper" transistor 697, a first NMOS "keeper" transistor 699 and an inverting output driver 701 all connected at a common signal junction 703.

The pull-down sub-circuit 695 implements the logic for asserting the output Z. The output should be asserted if either:

1) A and B are asserted; or
2) A and C are asserted; or
3) A and D are asserted; or
4) any one of A, B, C or D is asserted and the output Z was asserted.

The first condition is implemented by first and second NMOS transistors 705,707, the first 705 having a gate connected to signal B, the second 707 having a gate connected to signal A, both connected in series between the common signal junction 703 and ground. The second condition is implemented by third and fourth NMOS transistors 709,711 connected in series between the common signal junction 703 and ground. The third condition is implemented by fifth and sixth NMOS transistors 713,715 connected between the common signal junction 703 and ground.

The fourth condition is implemented by a seventh "keeper" NMOS transistor 699. As with the circuits shown in FIGS. 16,17 and 18, the output Z is not used as a separate logic input, but to control a weak device preventing the circuit from switching when the common signal junction 703 otherwise would be isolated.

The pull-up sub-circuit 693 includes first, second, third and fourth PMOS transistors 717,719,721,723, connected in series, each connected to one of the inputs A,B,C or D. When all four inputs are NULL, the four PMOS transistors 717,719,721,723 switch on, pulling the common signal junction 703 high and causing the inverting output driver 701 to generate a NULL output. When one, two, or three of the inputs is NULL, the keeper transistors 697,699 prevent the common signal junction 703 from being isolated and holds the circuit in the previous state.

Note that the first, third and fifth NMOS transistors 705,709,713 connect directly to the common signal junction 707. The B input connects to one and only one of these three transistors, the C input connects to one and only one, and the D input connects to one and only one. This arrangement minimizes the charge sharing between junctions.

Figure 20A:
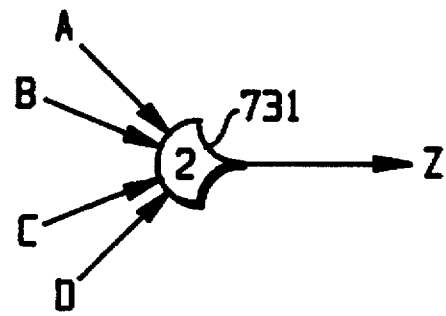
FIG. 20a illustrates a symbol for a four-input threshold-two gate (two-of-four) with a two mutually exclusive assertion groups of two inputs each.

FIG. 20a illustrates a symbol 731 for a four-input threshold-two gate (two-of-four) with two mutually exclusive assertion groups of two inputs each. It is functionally the same as the two-of-four gate shown in FIG. 5a.

Figure 20B:
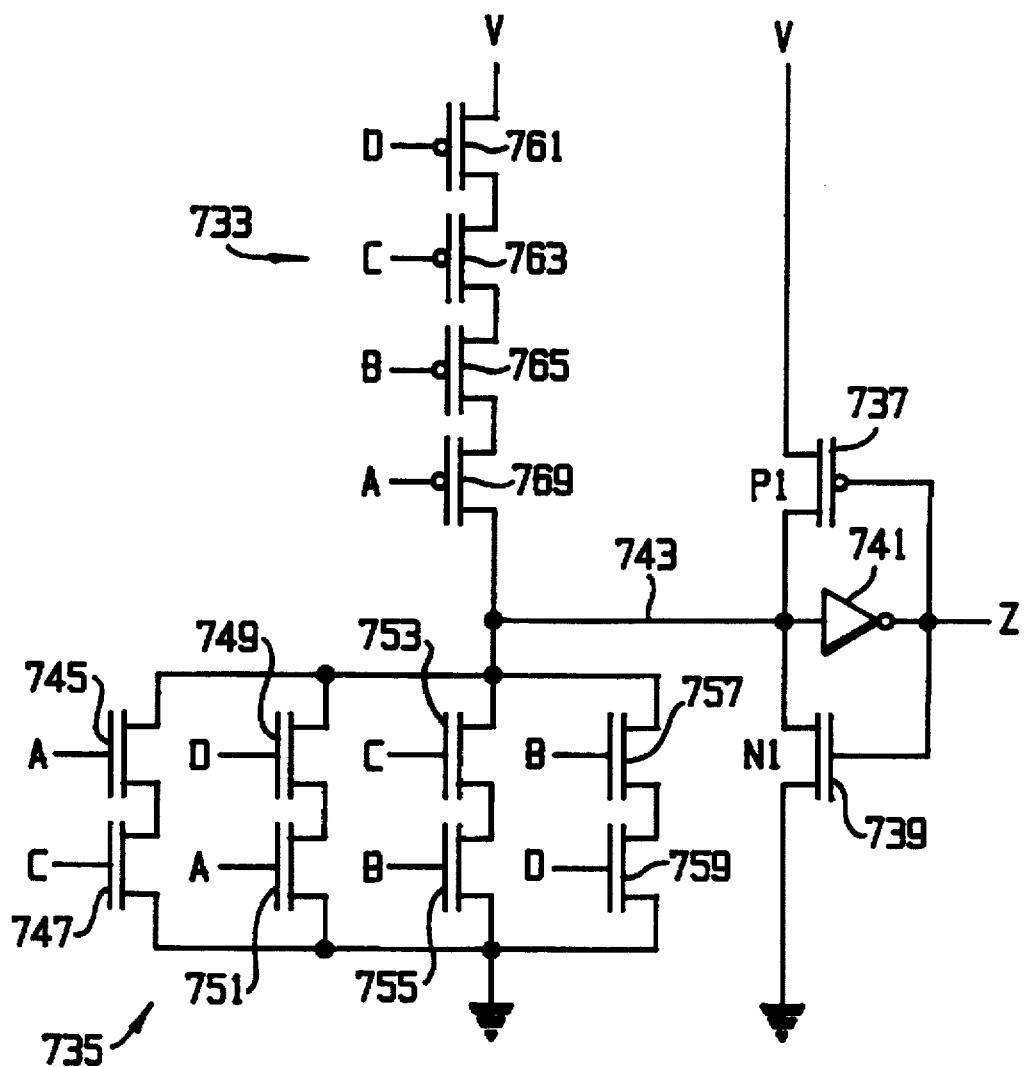

FIG. 20b illustrates a transistor-level circuit diagram of a semi-static CMOS implementation for the gate of FIG. 20a. The circuit includes a pull-up sub-circuit 733, a pull-down sub-circuit 735, a first PMOS "keeper" transistor 737, a first NMOS "keeper" transistor 739 and an inverting output driver 741 all connected at a common signal junction 743.

The pull-down sub-circuit 735 implements the logic for asserting the output Z. The output should be asserted if either:

1) A and C are asserted; or
2) A and D are asserted; or
3) B and C are asserted; or
4) B and D are asserted; or
5) any one of A, B, C or D is asserted and the output Z was asserted.

The first condition is implemented by first and second NMOS transistors 745,747, the first 745 having a gate connected to signal A, the second 747 having an input connected to signal b, both connected in series between the common signal junction 743 and ground. The second condition is implemented by third and fourth NMOS transistors 749,751 connected in series between the common signal junction 743 and ground. The third condition is implemented by fifth and sixth NMOS transistors 753,755 connected between the common signal junction 743 and ground. The fourth condition is implemented by seventh and eighth NMOS transistors 757,759 connected between the common signal junction 743 and ground.

The fifth condition is implemented by a ninth "keeper" NMOS transistor 739. As with the circuits shown in FIGS. 16,17,18 and 19, the output Z is not used as a separate logic input, but to control a weak device preventing the circuit from switching when the common signal junction 743 otherwise would be isolated.

The pull-up sub-circuit 733 includes first, second, third and fourth PMOS transistors 761,763,765,769, connected in series, each connected to one of the inputs A,B,C or D. When all four inputs are NULL, the four PMOS transistors 761,763,765,769 switch on, pulling the common signal junction 743 high and causing the inverting output driver 741 to generate a NULL output. When one, two, or three of the inputs A,B,C, and D is NULL, the keeper transistors 737,739 prevent the common signal junction 743 from being isolated and holds the circuit in the previous state.

Note that the first, third, fifth, and seventh NMOS transistors 745,749,753,757 connect directly to the common signal junction 747. The A input connects to one and only one of these three transistors, the B input connects to one and only one, the C input connects to one and only one, and the D input connects to one and only one. This arrangement minimizes the charge sharing between junctions.

Figure 21:
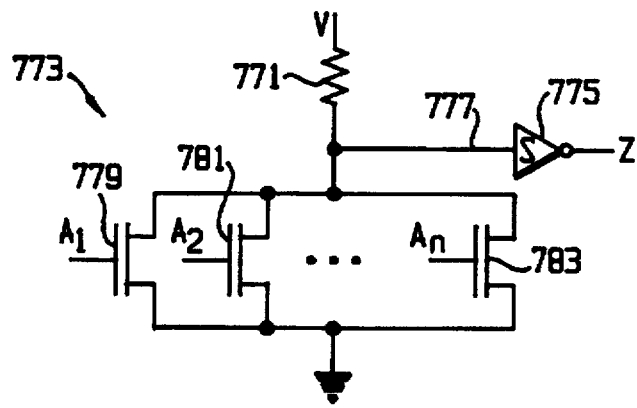
FIG. 21 illustrates a transistor-level circuit diagram of a first analog implementation for an n-of-n gate.

FIG. 21 illustrates a transistor-level circuit diagram of a first analog implementation for an m-of-n gate of FIG. 12a. The circuit includes a resistor 771, a pull-down sub-circuit 773 and an inverting output driver 775 all connected at a common signal junction 777.

The pull down network 773 includes a number n of NMOS transistors connected in parallel between the common signal junction 777 and ground. Each NMOS transistor has a gate connected to one of the input signals. The resistor 771 is connected between a voltage source V and the common signal junction 777. The input of the inverting driver 775 is also connected to the common signal junction 777. The inverting driver 775 is a Schmitt trigger, which has a characteristically wide switching band. The resistor/transistor network forms a voltage divider such that the voltage at the common signal junction 777 is a function of the number of asserted inputs. The switching thresholds of the inverting driver 775 must be designed so that the lower trigger voltage corresponds to voltage generated with the number of transistors turned on is at or greater than the desired gate threshold. The upper trigger voltage must also be designed so that the output remains asserted until all inputs have returned to NULL.

Figure 22:
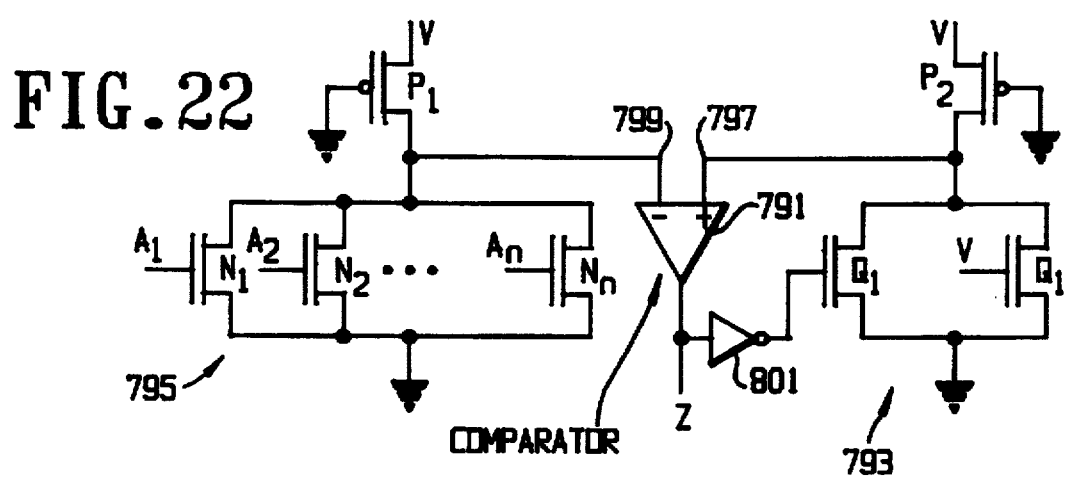
FIG. 22 illustrates a transistor-level circuit diagram of a second analog implementation for the m-of-n gate.

FIG. 22 illustrates a transistor-level circuit diagram of a second analog implementation for an m-of-n gate of FIG. 12a. The circuit includes a comparator 791, a reference/feedback sub-circuit 793, and an input-logic sub-circuit 795. The reference/feedback sub-circuit 793 receives the Z output from the comparator 791, and generates a reference voltage for the "plus" terminal 797 of the comparator 791. The input-logic sub-circuit 795 receives inputs A1, A2, . . . , An and generates a comparative voltage for the "minus" terminal 799 of the comparator 791.

The input-logic sub-circuit 795 includes a first PMOS transistor P1 connecting a voltage source V to the minus terminal 799. The gate of the first PMOS transistor P1 is tied to ground so that the transistor is always pulling the minus terminal voltage 799 toward a high voltage. A network of NMOS transistors N1,N2, . . . , Nn connected in parallel between the minus terminal 799 and ground. Each gate of each NMOS transistor of the network connects to one of the inputs signals A1,A2, . . . , An. As an increasing number of inputs are asserted, more NMOS transistors N1,N2, . . . , Nn switch on, the voltage of the minus terminal 799 steps down incrementally.

The reference/feedback sub-circuit 793 includes a second PMOS transistor P2 connecting the voltage source V to the comparator plus terminal 797. The gate of the second PMOS transistor P2 is tied to ground. A network of two parallel NMOS transistors Q1,Q2 connect the plus terminal to ground. The first NMOS transistor Q1 has its gate connected to the output signal Z through inverter 801, and the second NMOS transistor Q2 has its gate tied to the source voltage V.

When all inputs A1,A2, . . . An are NULL, NMOS transistors of the input-logic sub-circuit 795 are off and the first PMOS transistor P1 holds the minus terminal 799 at the source voltage. The second NMOS transistor Q2 pulls the plus terminal below the source voltage so that the plus terminal voltage is below the minus terminal voltage and comparator 791 is off. The first NMOS transistor Q1 is on, which pulls the plus terminal voltage even further below the source voltage, and the circuit is in a steady state. When the first and second PMOS transistors P1,P2 are identical, the second NMOS transistor Q2 can be assured of pulling the plus terminal 797 below the minus terminal 799.

The threshold at which the circuit switches (i.e., the number of asserted inputs which cause the output to be asserted) can be adjusted by sizing the first NMOS transistor Q1 relative to the NMOS transistors N1,N2, . . . , Nn of the input -logic sub-circuit 795. The voltage of the comparator's minus terminal 799 steps down incrementally as more inputs are asserted, i.e., as more NMOS transistors N1,N2, . . . , Nn of the input logic sub-network turn on. The first NMOS transistor Q1 can be sized to generate a reference voltage on the plus terminal 797 that corresponds to the voltage produced by the input-logic sub-circuit 795 on the minus terminal 799 when the number of asserted inputs is the threshold number.

The action of the feedback signal Z through inverter 801 to the gate of the first NMOS transistor Q1 prevents the output Z from returning to NULL until all inputs A1,A2, . . . , An return to NULL. When the output is asserted, the first NMOS transistor Q1 turns off. The second PMOS transistor P2 pulls the voltage of the comparator's plus terminal 797 to very close to the source voltage. (The action of second NMOS transistor Q2 pulls the voltage to slightly below the source voltage.) With the plus terminal voltage now so high, the comparator 791 will turn off only when the voltage at the minus terminal 799 rises fully to the source voltage, i.e., when all the inputs A1,A2, . . . , An return to NULL and all NMOS transistors of the input-logic sub-circuit 795 have switched off.

The devices can be sized in a variety of ways. One set of sizes begins by making the PMOS transistors P1,P2 identical so that their effect on the plus and minus terminals of the comparator will balance. The NMOS transistors N1,N2, . . . , Nn of the input logic sub circuit 795 can be sized relative to the first PMOS transistor P1 so that the incremental action of asserted inputs will cause the voltage at the comparator's minus input 799 to step down across a substantial portion of voltage range. The second NMOS transistor Q2 of the feedback/reference sub-circuit 793 is sized so that it pulls down the voltage of the plus terminal 797 by an amount approximately one-half of the first threshold step (i.e., one-half of the amount that one logic-input NMOS transistor N1,N2, . . . , Nn) pulls down the minus terminal 799). The first NMOS transistor Q1 of the feedback/reference sub-circuit 793 can be made to be equivalent (in voltage action on the plus terminal 797) to a number m of NMOS transistors N1,N2, . . . , Nn of the input logic sub circuit 795 (and their voltage action on the minus terminal 799). The first NMOS transistor can even be implemented as a number m of parallel NMOS transistors, each identical to those of the input-logic sub-circuit 795.

Figure 23:
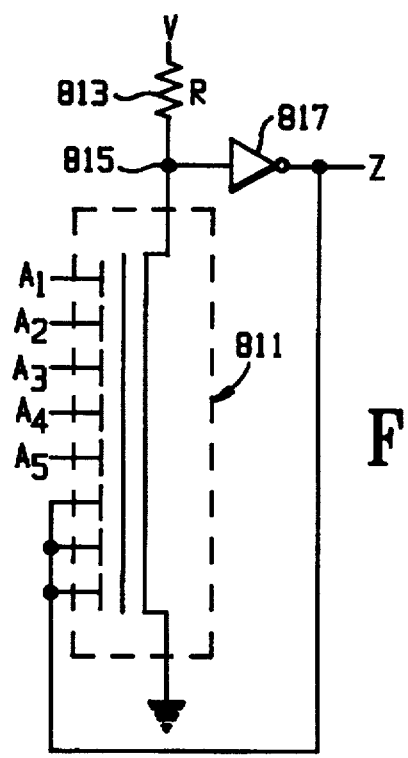

FIG. 23 illustrates a transistor-level circuit diagram of a floating-gate MOSFET implementation for four-of-five gate. The circuit includes a resistor 813 connecting a voltage source V to a common signal junction 815, and a "floating gate" n-input MOS device 811 connecting the common signal junction 815 to ground. An inverting driver 817 receives the voltage at the common signal junction as input, and generates the circuit output Z. Background about the MOS device 811 can be found in "Neuron MOSFET," *IEEE Trans. Electron Devices*, 39(6), pp. 1444–55 (1992). This device can be fabricated in a standard, double-poly process in which the multiple input gates (second layer) are capacitively coupled to a single floating gate (first layer). It has the characteristic that drain current increases as each additional input gate is turned on.

FIG. 23 illustrates a four-of-five gate. When four or more signal inputs A1,A2,A3,A4,A5 are asserted, the MOS device conducts sufficient current to pull the voltage at the signal junction 815 below the switching level of the inverting output driver 817.

The output signal Z is connected to three gates of the MOS device 811. These multiple feedback connections to the MOS input ensure that the output will not return to NULL until all five inputs have returned to NULL. The asserted output provides three asserted feedback inputs. As long as any one of the five signal inputs A1,A2,A3,A4,A5 remains asserted, the remaining asserted signal input and the three feedback inputs provides a total of four asserted gates, and the output remains asserted. When all five signal inputs return to NULL, the three asserted feedback inputs are no longer sufficient to pull the voltage of the common signal junction 815 below the output driver 817 switching threshold. Gates with varying thresholds can be implemented by connecting the output to a number of gates, that number being one less than the threshold.

Figure 24:
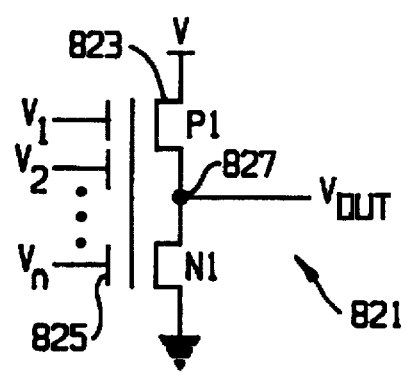
FIG. 24 illustrates a complementary floating-gate MOSFET.

FIG. 24 illustrates a complementary floating-gate MOSFET 821. The floating gate 823 is on polysilicon layer 1, and the n input gates 825 are on polysilicon layer 2 in a standard analog CMOS double-poly process. Physically, the input gates 825 are laid out in the field region between the PMOS area P1 and NMOS area N1. The output is taken at a junction 827 between the PMOS area P1 and the NMOS area N1. When the inputs V1,V2, . . . , Vn are low, the floating gate potential at ground and the PMOS area P1 provides a conduction path between the output 827 and the voltage source. As inputs go high, the floating gate voltage rises and the NMOS device provides a conduction path between the output 827 and ground. The output voltage Vout will vary depending on the relative contributions of the PMOS and NMOS areas. With proper design (as discussed more fully below), the device switching characteristics can be chosen so that only one of the two areas (PMOS and NMOS) will be the primary conducting region at a given time. Additional information about the MOS device 811 can be found in "Neuron MOSFET," *IEEE Trans. Electron Devices*, 39(6), pp. 1444–55 (1992).

Figure 25:
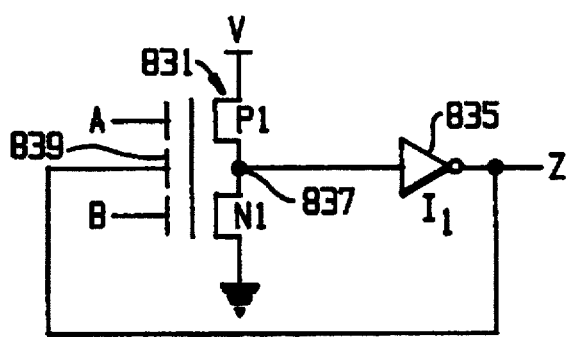
FIG. 25 illustrates a transistor-level circuit diagram of a complementary floating-gate MOSFET implementation for a 2-of-2 gate.

FIG. 25 illustrates a transistor-level circuit diagram of a complementary floating-gate MOSFET implementation for a 2-of-2 gate. The circuit includes a three-input complementary floating-gate MOSFET 831 and a standard static CMOS inverter 835 having an input connected to the floating gate MOSFET output 837. The inverter output Z is fed back as an input to a central input gate 839. It is assumed that the inputs A,B will transition between a ground voltage NULL state and a source voltage asserted state. The number of gates receiving the feedback signal Z is one less than the desired threshold value. All three input gates have the same dimensions.

For an inverter 835 having a switching point Vinv (i.e., the voltage above which Z=0 and below which Z=V), the input-gate-to-floating-gate capacitance is arrange relative to Vinv so that the following relationships hold:

1) if zero or one of the input gates is at V, then the voltage at the floating gate MOSFET output 837 is greater than Vinv, which causes a NULL output from the inverter 835.

2) if two or three of the input gates are at V, then the voltage at the floating gate MOSFET output 837 is less than Vinv, which causes an asserted output from the inverter 835.

Operation will be described by following a number of transitions of the inputs A,B. When A and B are both NULL (zero volts), the PMOS area P1 is active, floating gate MOSFET output 837 is greater than Vinv, and the inverter output Z is NULL. When both A and B are asserted (at the source voltage), the NMOS area N1 is active, the floating gate MOSFET output 837 is less than Vinv, and the inverter output Z is asserted.

When the output Z is asserted, the feedback line applies a positive voltage to one input gate 839. If one of the inputs A,B returns to NULL while the other input remains asserted, the asserted input and the asserted feedback hold the NMOS region N1 active, which holds the floating gate MOSFET output 837 below Vinv and holds the inverter output Z asserted. When both inputs A,B return to NULL, the single asserted feedback no longer is sufficient to hold the NMOS area active, the PMOS area is active, the floating gate MOSFET output 837 rises above Vinv, and the inverter output Z returns to NULL.

FIG. 26 illustrates a transistor-level circuit diagram of a complementary floating gate MOSFET implementation for a 2-of-n gate having two mutually exclusive assertion groups. The circuit includes a multiple-input complementary floating-gate MOSFET 841 and a standard static CMOS inverter 845 having an input connected to the floating gate MOSFET output 847. There are multiple inputs A1, . . . , An1 forming a first mutually exclusive assertion group, and multiple inputs B1, . . . ,Bn2 forming a second mutually exclusive assertion group. The inverter output Z is fed back as an input to the central gate 849. It is assumed that the inputs will transition between a ground voltage NULL state and a source voltage asserted state. The number of gates receiving the feedback signal Z is one less than the desired threshold value. All three input gates have the same dimensions.

Because at most one input from each mutually exclusive assertion group can be asserted, the MOSFET will receive at most two asserted inputs at one time in addition to an asserted feedback input. The MOSFET must be sized to accommodate the additional inputs. The operation of the circuit is analogous to that of the circuit of FIG. 25.

Figure 27A:
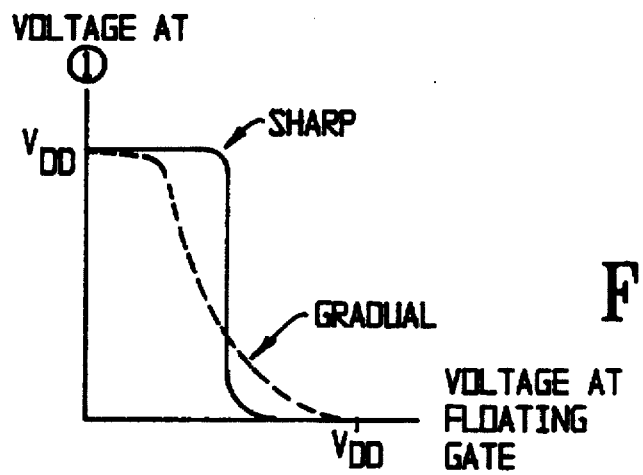
FIG. 27 illustrates DC transfer characteristics for the circuit of FIGS. 25 and 26.
Figure 27B:
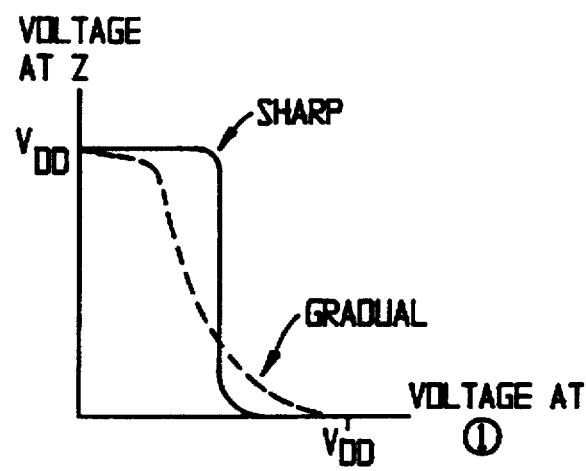

FIGS. 27a and 27b illustrate DC transfer characteristics for the circuits of FIGS. 25 and 26. FIG. 27a illustrates two exemplary relationships between the voltage at the floating gate MOSFET output 837,847 as a function of the voltage of the floating gate. One relationship is "sharp" and the other is "gradual." FIG. 27b illustrates two exemplary relationships between the inverter output Z as a function of the floating gate MOSFET output 837,847. Static power dissipation for the circuits depends on the transfer characteristics for the floating gate MOSFET and inverter. Sharp transfer characteristics will lead to essentially zero DC power dissipation, because either the NMOS or the PMOS regions in the floating gate MOSFET and in the inverter will be off under all static conditions. However, gradual transfer characteristics may lead to significant DC power dissipation when the floating gate MOSFET or the inverter is mid-way through the hysteresis cycle (going in either direction). For example, when one input is asserted and all others are NULL, the floating gate will rise to a voltage above ground. For the gradual transfer characteristics, some current will flow from the voltage source to ground through the floating gate MOSFET. In addition, the voltage at the floating gate MOSFET output will be somewhat below the source voltage, so that some current will also flow from the voltage source to ground through the standard inverter. A complementary situation exists when the output is asserted and the number of asserted inputs is falling. One suitable method for achieve sharp transfer curves is to use larger than minimum size transistors.

Figure 28:
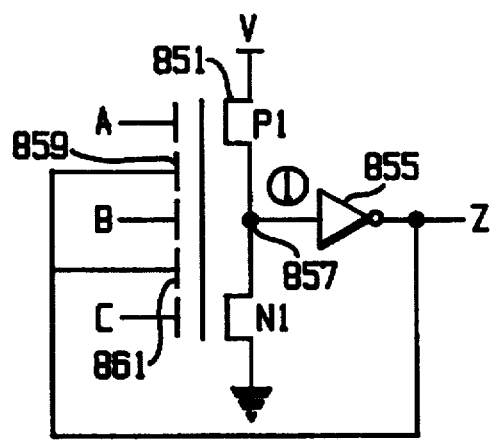
FIG. 28 illustrates a transistor-level circuit diagram of a complementary floating-gate MOSFET implementation for a 3-of-3 gate.

FIG. 28 illustrates a transistor-level circuit diagram of a complementary floating-gate MOSFET implementation for a 3-of-3 gate. The circuit includes a five-input complementary floating-gate MOSFET 851 and a standard static CMOS inverter 855 having an input connected to the floating gate MOSFET output 857. There are three inputs A,B,C. The inverter output Z is fed back as two additional inputs to two gates 859,861. It is assumed that the inputs A,B and C will transition between a ground voltage NULL state and a source voltage asserted state. The number of gates receiving the feedback signal Z is one less than the desired threshold value.

With the output fed back, it is possible to have a single return line and a single gate which is twice the size of gates receiving signal inputs A,B,C. However, it is preferred that all five input gates have the same dimensions in order to match the feedback-gate characteristics with the input-signal-gate characteristics.

The operation of the circuit is analogous to that of the circuit of FIG. 25. For an inverter 855 having a switching point Vinv (i.e., the voltage above which Z=0 and below which Z=V), the input-gate-to-floating capacitance is arrange relative to Vinv so that the following relationships hold:

1) if zero, one or two of the input gates is at V, then the voltage at the floating gate MOSFET output 857 is greater than Vinv, which causes a NULL output from the inverter 855.

2) if three or more of the input gates are at V, then the voltage at the floating gate MOSFET output 857 is less than Vinv, which causes an asserted output from the inverter 855. The circuit obeys the requirement that the output becomes asserted when the number of asserted inputs equals or exceeds the threshold, and remains asserted until all inputs return to NULL.

Figure 29:
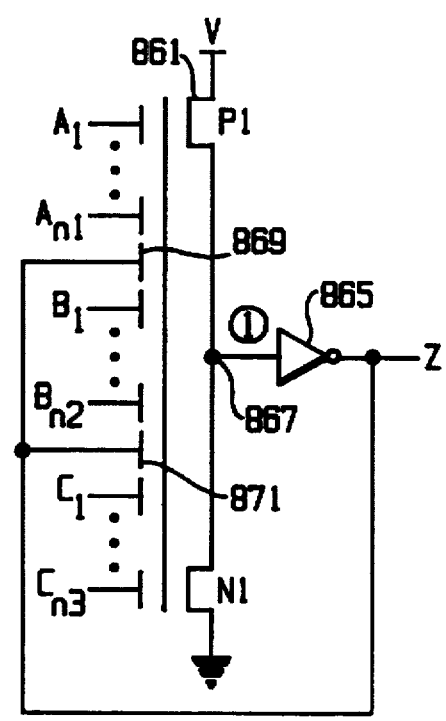
FIG. 29 illustrates a transistor-level circuit diagram of a complementary floating-gate MOSFET implementation for a 3-of-n gate having three mutually exclusive assertion groups.

FIG. 29 illustrates a transistor-level circuit diagram of a complementary floating-gate MOSFET implementation for a 3-of-n gate having three mutually exclusive assertion groups. The circuit includes a multiple-input complementary floating-gate MOSFET 861 and a standard static CMOS inverter 865 having an input connected to the floating gate MOSFET output 867. There are multiple inputs A1, . . . , An1 forming a first mutually exclusive assertion group, multiple inputs B1, . . . , Bn2 forming a second mutually exclusive assertion group, and multiple inputs C1, . . . , Cn3 forming a third mutually exclusive assertion group. The inverter output Z is fed back as an input to two gates 869,871. It is assumed that the inputs will transition between a ground voltage NULL state and a source voltage asserted state. The number of gates receiving the feedback signal Z is one less than the desired threshold value. All input gates have the same dimensions.

The operation of the circuit is analogous to that of the circuit of FIG. 28. The MOSFET must be sized to accommodate the additional inputs. Because at most one input from each mutually exclusive assertion group can be asserted, the MOSFET will receive at most three asserted inputs at one time (in addition to the feedback inputs).

Figure 30A:
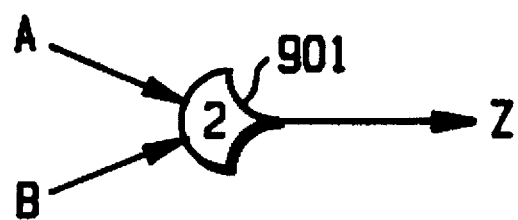
FIGS. 30a and 30B illustrate a symbol and a first transistor-level circuit diagram of a current-mode NULL convention threshold gate.

FIG. 30a illustrates a symbol 901 for a two-input threshold-two gate (two-of-two). It is functionally the same as the two-of-two gate illustrated in FIG. 3a.

Figure 30B:
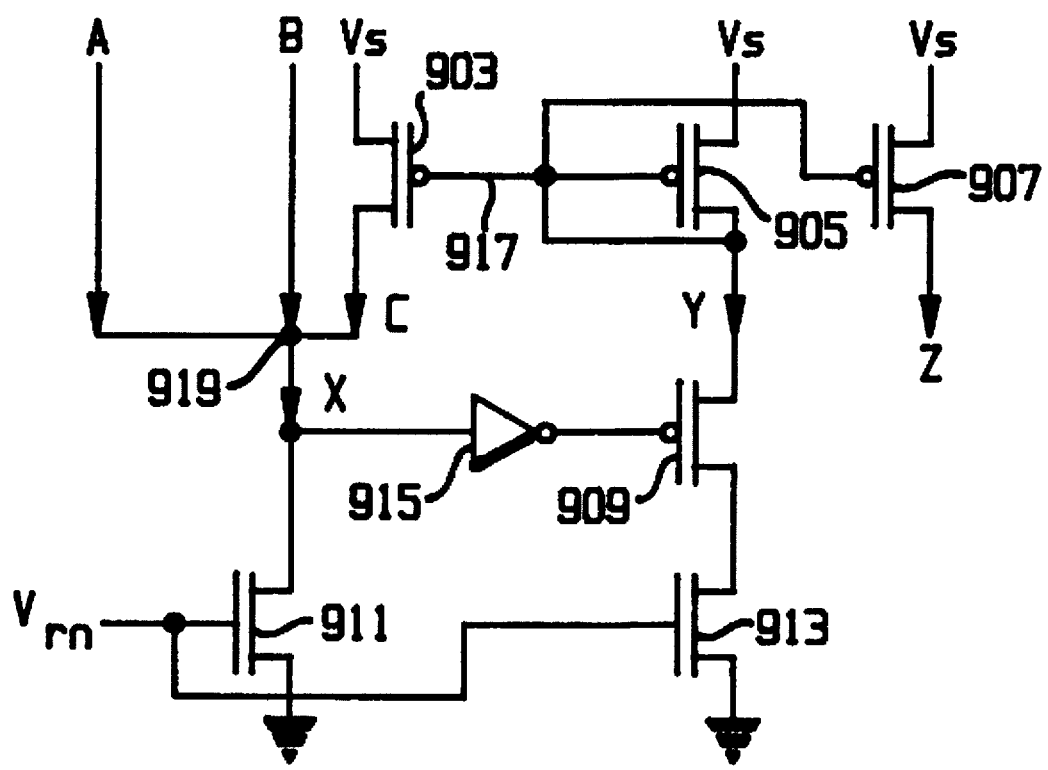

FIG. 30b illustrates a transistor-level circuit diagram of a current-mode CMOS implementation for the gate of FIG. 30a. Background information relating to current-mode CMOS logic can be found in A. Jain et al., *IEEE Trans. on Circuits and Systems-1*, Vol. 40, pp 503-522, 1993.

The circuit of FIG. 30b includes a group of three PMOS transistors 903,905,907, a fourth PMOS transistor 909 two NMOS transistors 911,913 and an inverter 915. Inputs A and B, and output Z are current signals. A current level of zero will be taken as NULL by convention, while a unit current Io will be taken as ASSERTED, although other current assignments can be made. Internal current signals C and Y in the circuit are designed to be integer multiples of the unit current Io.

The two input signal lines A and B connect together at a common node 919. The common node 919 also receives current signal C from the drain of PMOS transistor 903. Node 919 sums the two input signal currents A,B and the drain current C. The sum of the three currents A,B and C is designated as X.

(i) $X = A + B + C$

NMOS transistor 911 forms a threshold element (without any hysteresis). The drain of NMOS transistor 911 connects to the common node 919. The source of NMOS transistor 911 connects to ground, and the gate of NMOS transistor 911 connects to a reference voltage. When the combined current X from the common node 919 is greater or equal to than a threshold KIo (K being an integer, Io being a unit current), the voltage at the common node 919 is high (near the voltage source Vs). When the combined current X from the common node 919 is less than the threshold KIo, the voltage at the common node 919 will be low (near ground). The threshold K can be set by adjusting the gate voltage Vrn of the NMOS transistor 911, by adjusting the width/length ratio of the NMOS transistor 911, and by adjusting the trigger level of the inverter 915. The relationship between combined current X and voltage at node 919 is then:

(ii) if $X \geq 2Io$, then V(node 919)=high;

(iii) if $X < 2Io$, then V(node 919)=low.

The group of three PMOS transistors 903,905,907 each have a source connected to a voltage source Vs, and their respective gates are connected in parallel by common signal line 917. The three PMOS transistors have substantially the same design dimensions and characteristics. Because of the common gate connection and design dimensions, the drain currents C,Y,Z of the three PMOS transistors 903,905,907 will be substantially the same.

A central PMOS transistor 905, along with the fourth PMOS transistor 909 and one of the NMOS transistors 913, form a series connection between the voltage source Vs and ground. That is, the drain of the central PMOS transistor 905 connects to the source of PMOS transistor 909, the drain of PMOS transistor 909 connects to the drain of NMOS transistor 913, and the source of NMOS transistor 913 connects to ground. NMOS transistor 913 is designed so that the current Y from the central PMOS transistor is Io when the output of the inverter 915 is at ground.

The common signal line 917 also connects to the drain of the central PMOS transistor 905 together and to the source of the fourth PMOS transistor 909. As a result, the group of three PMOS transistors 903,905,907 are controlled as a group based on the states of the PMOS transistor 909 and NMOS transistor 913.

The PMOS transistor 909 has a gate connected, through an inverter, to node 919. As a result, when node 919 is at a high voltage, PMOS transistor 909 will be "on" and currents C,Y and Z will be Io. Conversely, when node 919 is at a low voltage, PMOS transistor 909 will be "off" and currents C,Y and Z will be zero. From relationships (ii) and (iii) above, the relationship between combined current X and current Y is:

(iv) if $X \geq 2Io$ (node 919 high), then Y=Io;

(iv) if $X < 2Io$ (node 919 low), then Y=zero.

Operation of the circuit will be described by following a series of input transitions. Initially, inputs A and B are NULL. Combined current X at node 919 is less than 2Io, and voltage at node 919 is low. Due to operation of the inverter 915, the gate voltage of PMOS transistor 909 is high, and currents C,Y and Z are zero.

If one of the inputs A or B becomes asserted (current equals Io), combined current X at node 919 remains less than 2Io, and the circuit state does not change.

If both of the inputs A and B become asserted (each having current equal to Io), the combined current X at node 919 equals 2Io. PMOS transistor 909 turns on, and currents C,Y and Z become Io. The circuit output has become asserted. The combined current at node 919 now becomes 3Io due to the contribution of current C from PMOS transistor 903.

If one of the inputs A or B now returns to NULL (current equals zero), the combined current at node 919 drops from 3Io to 2Io, but stays at or above the threshold. Therefore, the circuit state remains unchanged.

When both of the inputs A and B return to NULL (both currents equal zero), the combined current at node 919 falls below the threshold. PMOS transistor 909 switches off, and the currents C,Y and Z become zero. The circuit has returned to the NULL output state.

Figure 31A:
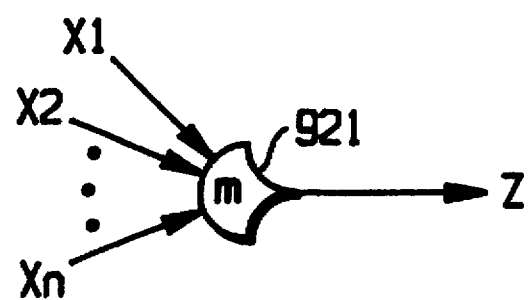
FIGS. 31a and 31b illustrate a symbol and a generalized transistor-level circuit diagram for current-mode NULL convention threshold gates.

FIG. 31a illustrates a symbol 921 for an n-input threshold-m gate (m-of-n). The output Z becomes asserted when at least m of the n inputs are asserted. The output Z returns to NULL only when all of the inputs becomes NULL. Although m may be equal to n, m will typically be less than n.

Figure 31B:
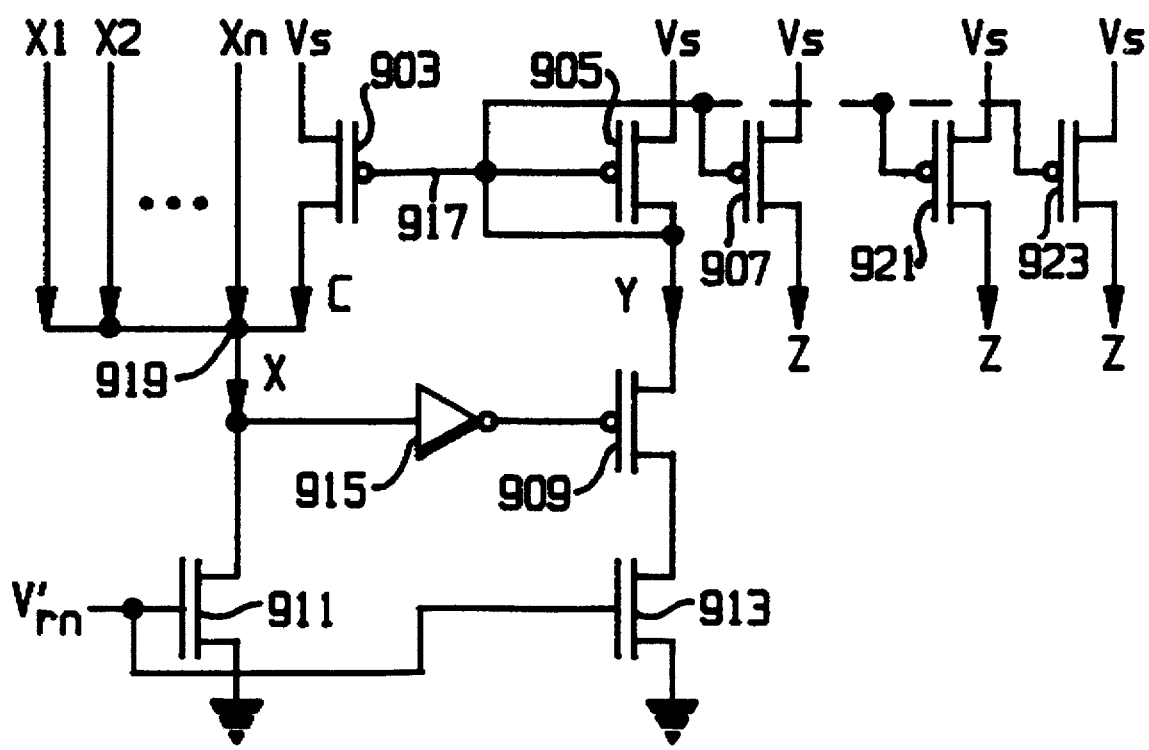

FIG. 31b illustrates a transistor-level circuit diagram of a current-mode CMOS implementation for the gate of FIG. 31a. Many of the circuit elements in FIG. 31b are identical to those of FIG. 30b. Elements in FIGS. 30b and 31b which are identical have identical reference numerals.

In the circuit of FIG. 31b, multiple input signal lines X1, X2..., Xn all connect at a common node 919. The common node 919 also receives a current signal from the drain of PMOS transistor 903.

The general operation of transistors 903, 905, 907, 909, 911, 913 and inverter 915 is the same as in the circuit of FIG. 30b. The circuit can be adapted to an arbitrary number of input lines simply by adding additional lines to the common node 919.

The threshold can be adjusted to an arbitrary threshold level by the design of the width/length dimensions of NMOS transistor 911, and by the selection of reference voltage V'rn. The width/length dimension of PMOS transistor 903 determines the weight of the feedback connection, which should be set so that PMOS transistor 903 provides a current C that is one current unit less than the threshold current. In this circuit, the organization of inputs into mutually exclusive assertion groups has no effect on circuit organization. Each additional input is an additional line to the common node 919.

The circuit of FIG. 31b also illustrates the optional use of multiple drive transistors 921,923 to provide greater fan out than the single transistor 907 illustrated in FIG. 30b. The circuit of FIG. 30b can be similarly adapted with additional drive transistors. Each additional drive transistor 921,923 has a source connected to a voltage source Vs and a gate connected to common signal line 917. The drains of each additional drive transistor 921,923 provide additional output current.

It should be understood that current-mode threshold gates can be combined into more complex NULL convention combinational circuits. It should also be understood that current-mode NULL convention threshold circuits can be fabricated with other technologies, such as BiCMOS technology.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. A NULL convention threshold gate comprising:

a plurality of input signal lines, each having an asserted stated and a NULL state;

an output signal line having an asserted state and a NULL state;

assertion means for placing the output signal line in an asserted state when the number of asserted input signal lines exceeds a threshold number; and means for holding the output signal line in an asserted state until all input signal lines have returned to NULL;

wherein an asserted state is characterized by a first current state, and a NULL state is characterized by a second current state.

2. A NULL convention threshold gate comprising:

a plurality of input signal lines, each having an asserted state and a NULL state;

an output signal line having an asserted state and a NULL state;

a first sub-circuit for placing the output signal line into the asserted state when the number of asserted input signal lines exceeds a threshold number; and a second sub-circuit for placing the output signal line into the NULL state when all inputs have returned to NULL;

wherein an asserted state is characterized by a first current state, and a NULL state is characterized by a second current state.

3. A combinational circuit comprising a plurality of interconnected NULL convention threshold gates, each NULL convention threshold gate comprising:

a first sub-circuit for placing the output signal line into the asserted state when the number of asserted input signal lines exceeds a threshold number; and a second sub-circuit for placing the output signal lines into the NULL state when all inputs have returned to NULL;

wherein an asserted state is characterized by a first current state, and a NULL state is characterized by a second current state.

4. A current mode m-of-n NULL convention threshold gate with hysteresis comprising:

a plurality of n input signal lines, each line having an asserted state and a NULL state, wherein the asseted state is characterized by a first current state, and the NULL state is characterized by a second current state;

an output signal line having an asserted state and a NULL state;

an output circuit switchably generating an asserted output signal and a NULL output signal on the output signal line; and a transistor network switching the output signal line from the asserted state to the NULL state when a number m of input signal lines changes from the NULL state to the asserted state, m being less than n, said switching circuit further holding the output signal line in an asserted state until all input signal lines return to NULL.

5. The gate of claim 4 further including a feedback circuit providing a feedback signal to the transistor network, said feedback signal varying in accordance with the state of the output signal line.

6. The gate of claim 5 wherein the feedback circuit includes a current-generating transistor operating in parallel with said output circuit and generating a feedback current signal on an input signal line.

7. The gate of claim 4 wherein the transistor network comprises:

a signal node receiving currents from the plurality of input signal lines; and a trigger circuit triggering the output circuit to generate an asserted output when a collective current traversing the signal node exceeds a threshold current.

8. The gate of claim 4 wherein the output circuit includes at least one current-providing output transistor responsive to the switching circuit.

9. The gate of claim 4 wherein the output circuit includes a plurality of current-providing output transistors responsive to the switching circuit and generating a plurality of substantially equal output currents.

10. The gate of claim 4 wherein the transistor network includes current mode MOS devices.

11. The gate of claim 4 wherein a first group of input signal lines forms a first mutually exclusive assertion group in which only one signal line is asserted at a time.

12. The gate of claim 4 wherein a plurality of groups of input signal lines form a plurality of mutually exclusive assertion groups in each of which only one signal line is asserted at a time.

13. The gate of claim 12 wherein the threshold number m equals the number of mutually exclusive assertion groups.

14. A current mode m-of-n NULL convention threshold gate with hysteresis comprising:

a plurality of n input signal lines, each line having an asserted state and a NULL state, wherein the asserted state is characterized by a first current state and the NULL state is characterized by a second NULL state;

an output signal line having an asserted state and a NULL state;

output means for switchably placing the output signal line in an asserted state and a NULL state; and hysteresis means for (1) placing the output means into the asserted state when a number of asserted input signal lines exceeds a threshold number m, said threshold value m less than n, (2) holding the output means in the asserted state when the number of asserted inputs signal lines falls to below the threshold number m while remaining greater than zero, and (3) placing the output means into the NULL state when all input signal lines are NULL.

15. The gate of claim 14 wherein the hysteresis means includes feedback means for providing a feedback signal to an input signal line, said feedback signal varying in accordance with the state of the output signal line.

16. The gate of claim 14 wherein the hysteresis means includes threshold means for generating a control signal having a first state when the collective current on the input signal lines exceeds a threshold value and having a second state when the collective current on the input signal lines is less than a threshold value.

17. The gate of claim 14 wherein the output means includes a first current generating means generating a current in response to the hysteresis means.

18. The gate of claim 14 wherein the output means includes a plurality of current generating means generating a plurality of substantially equal currents in response to the hysteresis.

19. The gate of claim 14 wherein a first group of input signal lines forms a first mutually exclusive assertion group in which only one signal line is asserted at a time.

20. The gate of claim 14 wherein a plurality of groups of input signal lines form mutually exclusive assertion groups, wherein only one signal line of a mutually exclusive assertion group is asserted at a time.

* * * * *